(12) United States Patent
Irie et al.

(10) Patent No.: US 7,494,762 B2
(45) Date of Patent: Feb. 24, 2009

(54) POSITIVE RESIST COMPOSITION FOR IMMERSION LITHOGRAPHY AND METHOD FOR FORMING RESIST PATTERN

(75) Inventors: Makiko Irie, Kanagawa-ken (JP); Yasuhiro Yoshii, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 11/871,399

(22) Filed: Oct. 12, 2007

(65) Prior Publication Data
US 2008/0090171 A1 Apr. 17, 2008

(30) Foreign Application Priority Data
Oct. 13, 2006 (JP) ............................ 2006-280201

(51) Int. Cl.
G03F 7/004 (2006.01)
G03F 7/30 (2006.01)

(52) U.S. Cl. .................. 430/270.1; 430/326; 430/910

(58) Field of Classification Search ............. 430/270.1, 430/326, 910
See application file for complete search history.

(56) References Cited

U.S. PATENT DOCUMENTS

| 5,908,730 | A | 6/1999 | Nitta et al. | |
|---|---|---|---|---|
| 6,180,313 | B1 | 1/2001 | Yukawa et al. | |
| 2005/0282985 | A1* | 12/2005 | Koyama et al. | 526/247 |
| 2006/0058480 | A1* | 3/2006 | Koyama et al. | 526/242 |

FOREIGN PATENT DOCUMENTS

| JP | 09-208554 | 8/1997 |
|---|---|---|
| JP | 11-35551 | 2/1999 |
| JP | 11-35552 | 2/1999 |
| JP | 11-35573 | 2/1999 |
| JP | 11-322707 | 11/1999 |
| WO | WO 2004/074242 A2 | 9/2004 |

OTHER PUBLICATIONS

Gil et al., *First Microprocessors with Immersion Lithography*, Proceedings of SPIE, vol. 5754, 119-128 (2005).
Kodama et al., *Synethsis of Novel Fluoropolymer for 157nm Photoresists by Cyclo-polymerization*, Proceedings of SPIE, vol. 4690, 76-83 (2002).

* cited by examiner

*Primary Examiner*—John S Chu
(74) *Attorney, Agent, or Firm*—Knobbe, Martens, Olson & Bear LLP

(57) ABSTRACT

Provided are a positive resist composition for immersion lithography, and a method for forming a resist pattern using the same, wherein the positive resist composition comprises a resin component (A) that increases its alkali solubility under action of an acid, an acid generator component (B) that generates an acid upon exposure, and a resin component (C) containing a constituent unit (c1) represented by the following Chemical Formula 1:

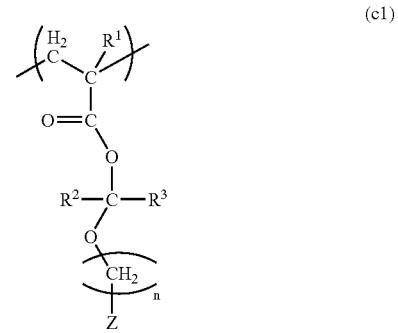

wherein $R^1$ is a hydrogen atom or a methyl group; $R^2$ and $R^3$ are each independently represents a hydrogen atom or an alkyl group having 1 to 5 carbon atoms; n is an integer of 0 to 3; and Z is an aliphatic cyclic group having 4 to 12 carbon atoms, having a fluorine atom and/or a fluorinated alkyl group as a substituent.

8 Claims, 2 Drawing Sheets

POSITIVE RESIST COMPOSITION FOR IMMERSION LITHOGRAPHY AND METHOD FOR FORMING RESIST PATTERN

BACKGROUND OF THE INVENTION

1. Field of the Invention

The present invention relates to a positive resist composition for immersion lithography, which is used for immersion exposure (immersion lithography), and a method for forming a resist pattern.

Priority is claimed on Japanese Patent Application No. 2006-280201, filed on Oct. 13, 2006, the content of which is herein incorporated by reference.

2. Description of the Related Art

A lithography technique involves, for example, the steps of forming a resist film formed of a resist material on a substrate, subjecting the resist film to selective exposure with radioactive rays such as light and electron beam, through a mask having a predetermined pattern formed thereon, and developing the resist film to form a resist pattern having a predetermined shape on the resist film.

Along with the refinement of semiconductor devices, developments have been made in making the wavelength of an exposure light source shorter and making the numerical aperture of a projection lens higher (higher NA). Thus, a developing apparatus having an NA of 0.84 using, as a light source, an ArF excimer laser having a wavelength of 193 nm has been developed so far. Further, as the wavelength of an exposure light source becomes shorter, a resist material is required to have improved lithography characteristics such as sensitivity to the exposure light source, and resolution which allows reproduction of patterns of fine dimensions. As a resist material satisfying such requirements, a chemically amplified resist which contains a base resin that has variable alkali solubility under action of an acid, and an acid generator that generates an acid upon light exposure, has been used.

At present, as the base resin for a chemically amplified resist used for an ArF excimer laser lithography, or the like, a resin having a constituent unit derived from a (meth)acrylic acid ester on its main chain (an acrylic resin), in view of excellent transparency to light at around 193 nm, or the like is generally used. As used herein, "(meth)acrylic acid" means either or both of an acrylic acid having a hydrogen atom bonded at an α position, and a methacrylic acid having a methyl group bonded at an α position.

The "(meth)acrylic acid ester" means either or both of an acrylic acid ester having a hydrogen atom bonded at an α position, and a methacrylic acid ester having a methyl group bonded at an α position.

The "(meth)acrylate" means either or both of an acrylate having a hydrogen atom bonded at an α position, and a methacrylate having a methyl group bonded at an α position.

For example, Proceedings of SPIE, Vol. 5754, pp. 119-128 (2005) (Non-Patent Document 1) discloses, as a technique for improving the resolution, a lithography method including as step of filling a liquid having a higher refractive index than that of air (hereinafter also referred to as a "immersion medium") between a projection lens and a specimen for exposure (immersion exposure), a so-called liquid immersion lithography, which is hereinafter also referred to as immersion lithography.

By the immersion lithography, even with the use of a light source having the same exposure wavelength, a high resolution that is equivalent to that in the case of using a light source having a short wavelength or in the case of a high NA lens can be attained, and there is no reduction in focal depth. Further, the immersion lithography can be carried out by using a conventional exposure apparatus. For this reason, it is expected that the immersion lithography will make it possible to form a resist pattern that is low cost, has high resolution, and is excellent in focal depth. Further, in the preparation of a semiconductor device which requires highly expensive facilities, immersion lithography has attracted much attention in the semiconductor industry from the viewpoints of cost and lithography characteristics such as resolution.

The immersion lithography is effective for formation of all sorts of pattern shapes. Further, it is believed that the immersion lithography can be combined with super resolution techniques such as a phase shift method, and a modified illumination method, which have been under investigation recently. At present, a technique in which an ArF excimer laser is mainly used as a light source is being actively investigated as an immersion lithography technique. Further, water has been mainly investigated as an immersion medium at present.

Recently, fluorine-containing compounds have been actively investigated in a variety of fields for their characteristics such as waterproofness and transparency. For example, in the field of a resist material, an approach that involves introducing an acid-labile group such as a methoxymethyl group, a tert-butyl group, and a tert-butyloxycarbonyl group to a fluorine-containing polymeric compound, thereby in order to make the component useful as a base resin for a positive chemically amplified resist, is being carried out at present. However, in the case where this fluorine-based polymeric compound is used as a base resin for a positive resist composition, there are drawbacks, such as generation of a large amount of out-gas after exposure, insufficient resistance to dry etching exposure (etching resistance), and so on.

For example, recently, a fluorine-containing polymeric compound having an acid-labile group containing a cyclic hydrocarbon group has been reported as a fluorine-containing polymeric compound having excellent etching resistance in Proceedings of SPIE, Vol. 4690, pp. 76-83 (2002) (Non-Patent Document 2).

SUMMARY OF THE INVENTION

In the immersion lithography, there is a need for a resist material that has suitable characteristics for a immersion lithography technique, in addition to common lithography characteristics (sensitivity, resolution, etching resistance, and the like). Specifically, in the case where water is used as a immersion medium, if immersion exposure is carried out by means of a scanning type immersion lithography apparatus as described in Proceedings of SPIE, Vol. 5754, pp. 119-128 (2005) (Non-Patent Document 1), the tracing property of water characterized in that the immersion medium shifts according to the shift of the lens is required. If the tracing property of water is low, the exposure speed is lowered, which would have an adverse influence on the productivity. It is thought that the tracing property of water is improved by increasing the hydrophobicity (hydrophobicization) of a resist film. However, even when the resist film is rendered hydrophobic, there is tendency that the lithography characteristics are deteriorated thereby. Thus, for example, there is a tendency of reduction in resolution, reduction in sensitivity, or increase in the amount of generated scum.

As such, in the immersion lithography, it is an important issue to develop a material having suitable hydrophobicity.

However, no material having both the lithography characteristics and the characteristics required for immersion lithography, etc. has essentially been known until now.

Under these circumstances, the present invention has been made, and it is an object of the present invention to provide a positive resist composition for immersion lithography having good lithography characteristics and suitable hydrophobicity for immersion lithography, and a method for forming a resist pattern.

In a first aspect of the present invention so as to solve the above-described problems, there is provided a positive resist composition for immersion lithography, including a resin component (A) that increases its alkali solubility under action of an acid, an acid generator component (B) that generates an acid upon exposure, and a resin component (C) containing a constituent unit (c1) represented by the following general formula (c1).

Chemical Formula 1

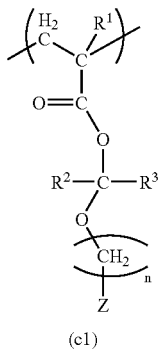

(c1)

wherein $R^1$ is a hydrogen atom or a methyl group; $R^2$ and $R^3$ are each independently a hydrogen atom or an alkyl group having 1 to 5 carbon atoms; n is an integer of 0 to 3; and Z is an aliphatic cyclic group having 4 to 12 carbon atoms, having a fluorine atom and/or a fluorinated alkyl group as a substituent.

In a second aspect of the present invention, there is provided a method for forming a resist pattern, including the steps of forming a resist film on a support, using the positive resist composition for immersion lithography according to the first aspect of the present invention, subjecting the resist film to immersion exposure, and developing the resist film to form a resist pattern.

In the present specification and claims, the "alkyl group" is intended to include a straight-chained, branched, and cyclic, saturated mono-valent hydrocarbon group, unless otherwise specified.

The "lower alkyl group" is an alkyl group having 1 to 5 carbon atoms.

The "alkylene group" is intended to include a straight-chained, branched, and cyclic, saturated di-valent hydrocarbon group, unless otherwise specified.

The "constituent unit" means a monomer unit constituting a polymeric compound (polymer).

The term "exposure" means to encompass general processes for irradiation with radiation.

According to the present invention, there can be provided a positive resist composition for immersion lithography having good lithography characteristics and suitable hydrophobicity for immersion lithography, and a method for forming a resist pattern.

The above and other objects, features, and advantages of the present invention will be apparent from the following description when taken in conjunction with the accompanying drawings, which illustrate preferred embodiments of the present invention by way of example.

DETAILED DESCRIPTION OF THE INVENTION

Positive Resist Composition for Immersion Lithography

Figure 1:
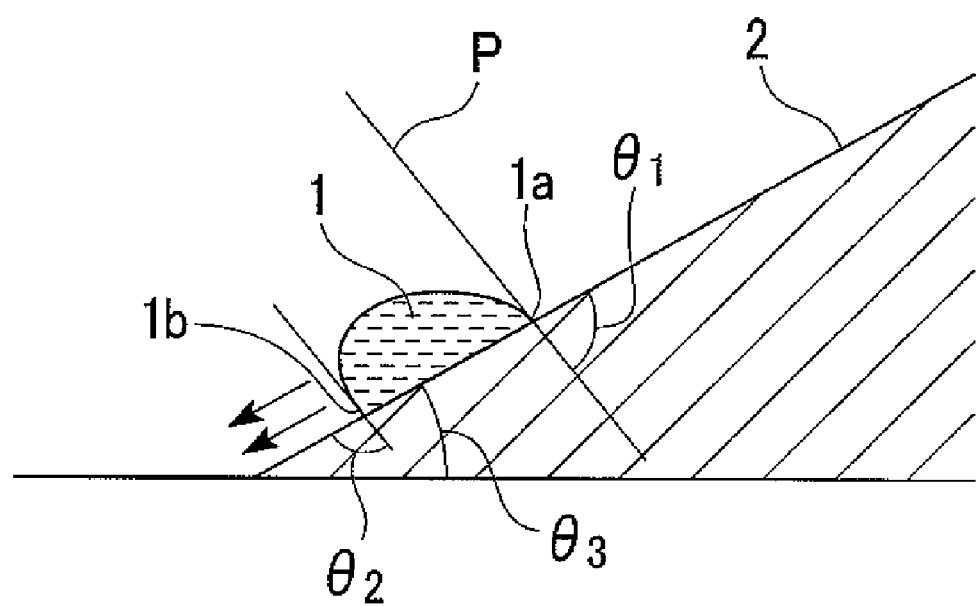
FIG. 1 is a view illustrating a sweepforward angle ($?_1$), a sweepback angle ($?_2$), and a sliding angle ($?_3$).

The positive resist composition for immersion lithography of the present invention includes a resin component (A) that increases its alkali solubility under action of an acid (hereinafter referred to as a component (A)), an acid generator component (B) that generates an acid upon exposure (hereinafter referred to as a component (B)), and a resin component (C) containing a constituent unit (c1) represented by the following general formula (c1) (hereinafter referred to as a component (C)).

In this positive resist composition, upon irradiation with radiation (exposure), an acid is generated from the component (B), and the alkali solubility of the component (A) is increased through the action of the acid. For this reason, in the formation of a resist pattern, if the resist film obtained by using the positive resist composition is subject to selective exposure, the alkali solubility of an exposed area is increased, while the alkali insolubility of an unexposed area is maintained as it is. Thus, by subjecting the resist film to alkali development a resist pattern can be formed.

Component (A)

Component (A) is not particularly limited, but any one selected from the conventionally known resin components of a chemically amplified positive resist composition, for example, a plurality of components that have been suggested as a resin component of a resist composition for an ArF excimer laser, and a resist composition for a KrF excimer laser, and the like, can be used as the component (A). As the resin component, there have been generally used alkali-insoluble resin components having a so-called acid dissociable, dissolution inhibiting group. This resin component is configured to have its acid dissociable, dissolution inhibiting group dissociated under action of an acid, and have its alkali-soluble group exposed, thereby increasing the alkali solubility. For this reason, in the formation of a resist pattern, if the resist film formed on a substrate, using the positive resist composition, is subject to selective exposure, the alkali solubility of an exposed area is increased, and by subjecting the resist film to alkali development, a resist pattern can be formed.

In the present invention, the component (A) is preferably a resin having a constituent unit derived from an acrylic acid ester. This resin has high transparency to an ArF excimer laser, and can be preferably used for lithography using the ArF excimer laser.

In the present invention, the proportion of the constituent unit derived from an acrylic acid ester in the component (A) is preferably 20 to 100% by mole, preferably 50 to 100% by mole, and possibly 100% by mole, based on the total amount of all the constituent units that constitute the component (A).

As used in the present specification and claims, the "constituent unit derived from an acrylic acid ester" means a constituent unit formed by dissociation of an ethylenic double bond of an acrylic acid ester.

The "acrylic acid ester" is intended to encompass an acrylic acid ester having a carbon atom at an α position bonded with a substituent (an atom or group other than a hydrogen atom), in addition to an acrylic acid ester having a carbon atom at an α position bonded with a hydrogen atom. Examples of the substituent include a halogen atom, a lower alkyl group, and a halogenated lower alkyl group. Further, the α position of the constituent unit derived from an acrylic acid ester (a carbon atom at an α position) is a carbon atom bonded with a carbonyl group, unless otherwise specified.

In the acrylic acid ester, examples of the halogen atom as a substituent at an α position include a fluorine atom, a chlorine atom, a bromine atom, and an iodine atom, and among these, a fluorine atom is particularly preferred.

Specific examples of the lower alkyl group as a substituent at an α position include a straight-chained or branched lower alkyl group such as a methyl group, an ethyl group, a propyl group, an isopropyl group, an n-butyl group, an isobutyl group, a tert-butyl group, a pentyl group, an isopentyl group, and a neopentyl group.

In the present invention, a hydrogen atom, a halogen atom, a lower alkyl group, or a halogenated lower alkyl group is preferably bonded at an α position of an acrylic acid ester, and among these, a hydrogen atom or a lower alkyl group is more preferably bonded, and from the viewpoint of industrial availability, a hydrogen atom or a methyl group is most preferably bonded.

Constituent Unit (a1)

In the present invention, the component (A) is preferably a constituent unit derived from an acrylic acid ester (a1) having an acid dissociable, dissolution inhibiting group.

As the acid dissociable, dissolution inhibiting group of the constituent unit (a1), use may be made of any one which has been suggested as a base resin for a chemically amplified resist having an alkali solution-inhibiting property, which allows the total component (A) to be insoluble in alkali before dissociation, and then changing this property so as to allow the total component (A) to be soluble in alkali after dissociation. Generally, as such the acid dissociable, dissolution inhibiting group, a group which is combined with a carboxyl group of (meth)acrylic acid, etc. to form a cyclic or chained tertiary alkyl ester; an acetal type acid dissociable, dissolution inhibiting group such as an alkoxyalkyl group, and the like have been widely known.

As used herein, the "tertiary alkyl ester" means a structure in which a hydrogen atom of its carboxyl group is substituted with a chained or cyclic alkyl group to form an ester, and an oxygen atom on the terminal of its carbonyloxy group (—C(O)—O—) is bonded with a tertiary carbon atom of the chained or cyclic alkyl group. Here, in order to make the tertiary carbon atom of the cyclic alkyl group acid-dissociable, two of three carbon atoms to be bonded with this atom constitute a cyclic alkyl group, and the other constitutes a chained alkyl group. In this tertiary alkyl ester, a linkage between an oxygen atom and a tertiary carbon atom is dissociated under action of an acid. The chained or cyclic alkyl group may have a substituent.

Hereinafter, a group which constitutes a carboxyl group and a tertiary alkyl ester to render them acid-dissociable, is referred to as a "tertiary alkyl ester type acid dissociable, dissolution inhibiting group" for convenience's sake.

Examples of the tertiary alkyl ester type acid dissociable, dissolution inhibiting group include an aliphatic branched, acid dissociable, dissolution inhibiting group, and an acid dissociable, dissolution inhibiting group containing an aliphatic cyclic group.

As used in the claims and specification of the present invention, the term "aliphatic" refers to a concept relative to aromatic, and is defined as a group, a compound, etc. that do not have aromatic.

The phrase "aliphatic branched" means a structure that does not have aromatic property. The structure of the "aliphatic branched acid dissociable, dissolution inhibiting group" is not limited to a group consisting of carbon and hydrogen (a hydrocarbon group), but a hydrocarbon group is preferred. Further, the "hydrocarbon group" may be saturated or unsaturated, but it is usually preferably saturated.

As the aliphatic branched acid dissociable, dissolution inhibiting group, a tertiary alkyl group having 4 to 8 carbon atoms is preferable, and specific examples thereof include a tert-butyl group, a tert-amyl group, and a tert-heptyl group.

The "aliphatic cyclic group" refers to a monocyclic group or polycyclic group that is aromatic.

The "aliphatic cyclic group" of the constituent unit (a1) may or may not have a substituent. Examples of the substituent include a lower alkyl group having 1 to 5 carbon atoms, a fluorine atom, a fluorinated lower alkyl group having 1 to 5 carbon atoms that has been substituted with a fluorine atom, and an oxygen atom (=O).

The structure of the basic ring from which the substituent of the "aliphatic cyclic group" is excluded is not limited to the group consisting of carbon and hydrogen (a hydrocarbon group), but a hydrocarbon group is preferred. The hydrocarbon group may be saturated or unsaturated, but it is usually preferably saturated. The "aliphatic cyclic group" is preferably a polycyclic group.

Specific examples of the aliphatic cyclic group include a group in which at least one hydrogen atom has been removed from a monocycloalkane, and a polycycloalkane such as bicycloalkane, tricycloalkane, and tetracycloalkane, which may or may not be substituted with a lower alkyl group, a fluorine atom, or a fluorinated alkyl group. More specific examples thereof include a group in which at least one hydrogen atom has been removed from a monocycloalkane such as cyclopentane and cyclohexane, and from a polycycloalkane such as adamantane, norbornane, isobornane, tricyclodecane, and tetracyclododecane.

Examples of the acid dissociable, dissolution inhibiting group containing an aliphatic cyclic group include a group containing a tertiary carbon atom on the ring backbone of the cyclic alkyl group. Specific examples thereof include a 2-methyl-2-adamantyl group and a 2-ethyl-2-adamantyl group. Otherwise, in the constituent unit represented by the following general formula (a1″), examples thereof include an aliphatic cyclic group such as an adamantyl group, which is a group bonded with an oxygen atom of a carbonyloxy group (—C(O)—O—), and a branched alkylene group having a tertiary carbon atom bonded with the aliphatic cyclic group.

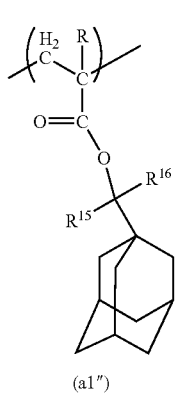

Chemical Formula 2

(a1″)

wherein R is a hydrogen atom, a halogen atom, a lower alkyl group, or a halogenated lower alkyl group, and $R^{15}$ and $R^{16}$ each represents an alkyl group (which may be straight-chained or branched, and preferably has 1 to 5 carbon atoms).

In the formula (a1″), examples of the halogen atom, the lower alkyl group, or the halogenated lower alkyl group as R include the same as those mentioned for the halogen atom, the lower alkyl group, or the halogenated lower alkyl group as a substituent at an α position in the above description on the acrylic acid ester, respectively.

The "acetal type acid dissociable, dissolution inhibiting group" generally allows a hydrogen atom on a terminal of an alkali-soluble group such as a carboxyl group and a hydroxyl group to be bonded with an oxygen atom. Further, when an acid is generated by exposure, a linkage between the acetal type acid dissociable, dissolution inhibiting group, and an oxygen atom bonded with the acetal type acid dissociable, dissolution inhibiting group is dissociated under action of an acid.

Examples of the acetal type acid dissociable, dissolution inhibiting group include a group represented by the following general formula (p1).

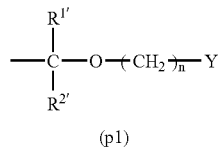

Chemical Formula 3

(p1)

wherein $R^{1'}$ and $R^{2'}$ each independently represents a hydrogen atom or a lower alkyl group, n represents an integer of 0 to 3, and Y represents a lower alkyl group or an aliphatic cyclic group.

In the above-described formula, n is preferably an integer of 0 to 2, more preferably 0 or 1, and most preferably 0.

Examples of the lower alkyl group of $R^{1'}$ and $R^{2'}$ include the same as those mentioned for the lower alkyl group as R, and among these, a methyl group or an ethyl group is preferred, and a methyl group is most preferred.

In the present invention, it is preferable that at least one of $R^{1'}$ and $R^{2'}$ be a hydrogen atom. That is, it is preferable that the acid dissociable, dissolution inhibiting group (p1) be a group represented by the following general formula (p1-1).

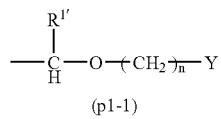

Chemical Formula 4

(p1-1)

wherein $R^{1'}$, n, and Y are each the same as defined above.

Examples of the lower alkyl group of Y include the same as those mentioned for the lower alkyl group as R.

As the aliphatic cyclic group of Y, use may be made of any one which is suitably selected from a plurality of monocyclic or polycyclic aliphatic cyclic groups that have been conventionally suggested as an ArF resist, etc. Further, examples thereof include the same as those mentioned for the aliphatic cyclic group.

Furthermore, examples of the acetal type acid dissociable, dissolution inhibiting group include a group represented by the following general formula (p2).

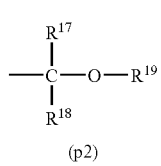

Chemical Formula 5

(p2)

wherein $R^{17}$ and $R^{18}$ are each independently represents a straight-chained or branched alkyl group or a hydrogen atom, and $R^{19}$ is a straight-chained, branched or cyclic alkyl group. Alternatively, $R^{17}$ and $R^{19}$ may be each independently represents a straight-chained or branched alkylene group, and a terminal of $R^{17}$ and a terminal of $R^{19}$ may be bonded with each other to form a ring.

In $R^{17}$ and $R^{18}$, the alkyl group preferably has 1 to 15 carbon atoms, and may be either straight-chained or branched. It is preferably an ethyl group or a methyl group, and most preferably a methyl group, It is particularly preferable that any one of $R^{17}$ and $R^{18}$ is a hydrogen atom, and the other be a methyl group.

$R^{19}$ is a straight-chained, branched or cyclic alkyl group, it preferably has 1 to 15 carbon atoms, and it may be any one of straight-chained, branched and cyclic.

If $R^{19}$ is straight-chained or branched, and preferably has 1 to 5 carbon atoms. It is preferably an ethyl group or a methyl group, and particularly preferably an ethyl group.

If $R^{19}$ is cyclic, and it preferably has 4 to 15 carbon atoms, more preferably 4 to 12 carbon atoms, and most preferably 5 to 10 carbon atoms. Specific examples thereof include a group in which at least one hydrogen atom has been removed from a monocycloalkane, and a polycycloalkane such as bicycloalkane, tricycloalkane, and tetracycloalkane, which may or may not be substituted with a fluorine atom or a fluorinated alkyl group. More specific examples thereof include a group in which at least one hydrogen atom has been removed from a monocycloalkane such as cyclopentane and cyclohexane, and from a polycycloalkane such as adamantane, norbornane, isobornane, tricyclodecane, and tetracyclododecane. Among these, a group in which at least one hydrogen atom has been removed from adamantane is preferred.

Furthermore, in the above-described formula, $R^{17}$ and $R^{19}$ are each independently represents a straight-chained or branched alkylene group (preferably an alkylene group having 1 to 5 carbon atoms), and a terminal of $R^{19}$ and a terminal of $R^{17}$ may be bonded with each other.

In this case, $R^{17}$ and $R^{19}$, and an oxygen atom bonded with $R^{19}$, and a carbon atom bonded with the oxygen atom and $R^{17}$ are bonded with each other to form a cyclic group. The cyclic group is preferably a 4 to 7-membered ring, and more preferably a 4 to 6-membered ring. Specific examples of the cyclic group include a tetrahydropyranyl group and a tetrahydrofuranyl group.

As the constituent unit (a1), at least one selected from the group consisting of a constituent unit represented by the following general formula (a1-0-1) and a constituent unit represented by the following general formula (a1-0-2) is preferably used.

Chemical Formula 6

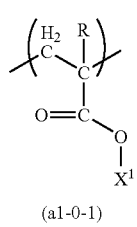

(a1-0-1)

wherein R represents a hydrogen atom, a halogen atom, a lower alkyl group, or a halogenated lower alkyl group; and $X^1$ represents an acid dissociable, dissolution inhibiting group.

Chemical Formula 7

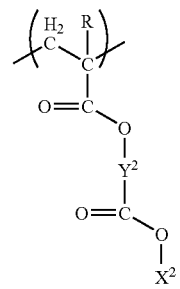

(a1-0-2)

wherein R represents a hydrogen atom, a halogen atom, a lower alkyl group, or a halogenated lower alkyl group; $X^2$ represents an acid dissociable, dissolution inhibiting group; and $Y^2$ represents an alkylene group or an aliphatic cyclic group.

In the general formula (a1-0-1), examples of the halogen atom, the lower alkyl group, or the halogenated lower alkyl group of R include the same as those mentioned for the halogen atom, the lower alkyl group, or the halogenated lower alkyl group, which may be bonded at an α position of the acrylic acid ester.

$X^1$ is not particularly limited as long as it is an acid dissociable, dissolution inhibiting group, and examples thereof include the above-described tertiary alkyl ester type acid dissociable, dissolution inhibiting groups, and acetal type acid dissociable, dissolution inhibiting groups, and among these, tertiary alkyl ester type acid dissociable, dissolution inhibiting groups are preferred.

In the general formula (a1-0-2), R is the same as defined above.

$X^2$ is the same as $X^1$ in the formula (a1-0-1).

$Y^2$ is preferably an alkylene group having 1 to 4 carbon atoms, or a divalent aliphatic cyclic group, and examples of the aliphatic cyclic group include the same as those mentioned in the above description of the aliphatic cyclic group, except that two hydrogen atoms have been removed therefrom.

Specifically, examples of the constituent unit (a1) include the constituent units represented by the following general formulae (a1-1) to (a1-4).

Chemical Formula 8

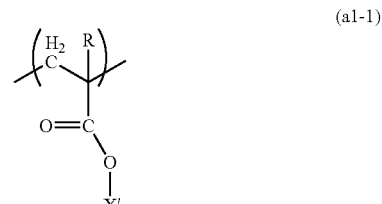

(a1-1)

-continued (a1-2)
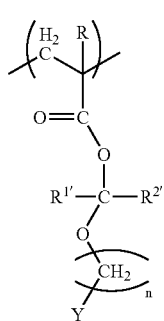

(a1-3)
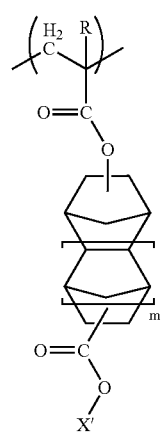

(a1-4)
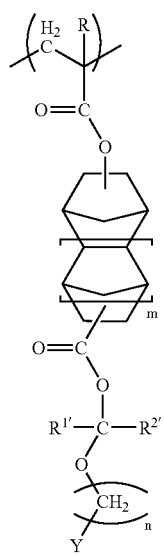

wherein X' represents a tertiary alkyl ester type acid dissociable, dissolution inhibiting group; Y represents a lower alkyl group having 1 to 5 carbon atoms, or an aliphatic cyclic group; n represents an integer of 0 to 3; m represents 0 or 1; R is the same as defined above; and $R^{1'}$ and $R^{2'}$ each independently represents a hydrogen atom or a lower alkyl group having 1 or 5 carbon atoms.

Preferably, at least one of $R^{1'}$ and $R^{2'}$ are a hydrogen atom, and more preferably both of them are hydrogen atoms. n is preferably 0 or 1.

Examples of X' include the same as the tertiary alkyl ester type acid dissociable, dissolution inhibiting groups which are exemplified above as $X^1$.

Examples of the aliphatic cyclic group of Y include the same as those exemplified in the description of "the aliphatic cyclic group" as above.

Hereinbelow, specific examples of the constituent units represented by the above-described general formulae (a1-1) to (a1-4) are shown.

Chemical Formula 9

(a1-1-1)
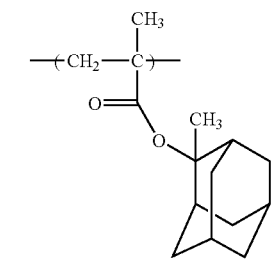

(a1-1-2)
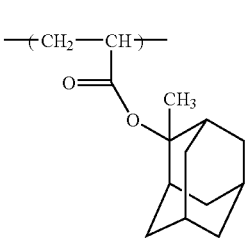

(a1-1-3)
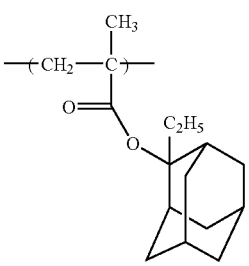

(a1-1-4)
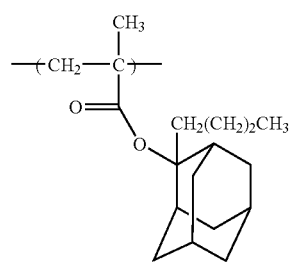

(a1-1-5)
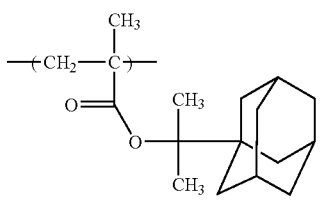

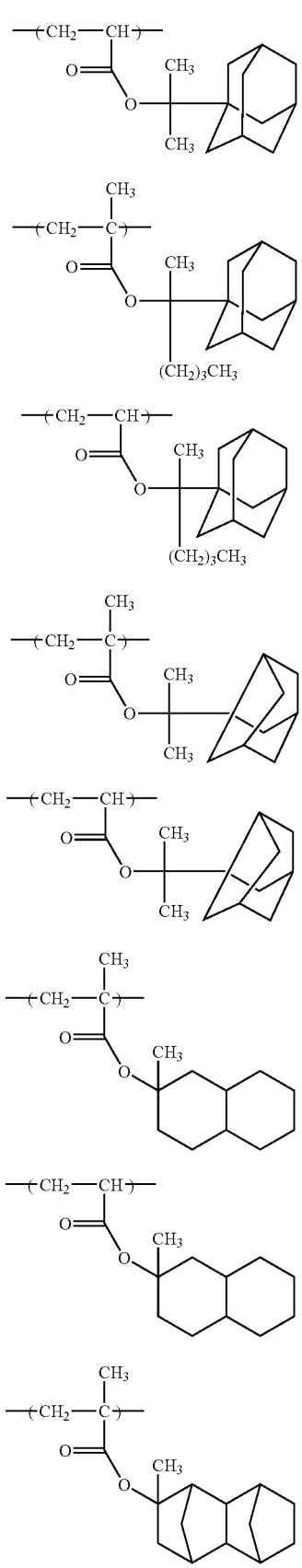
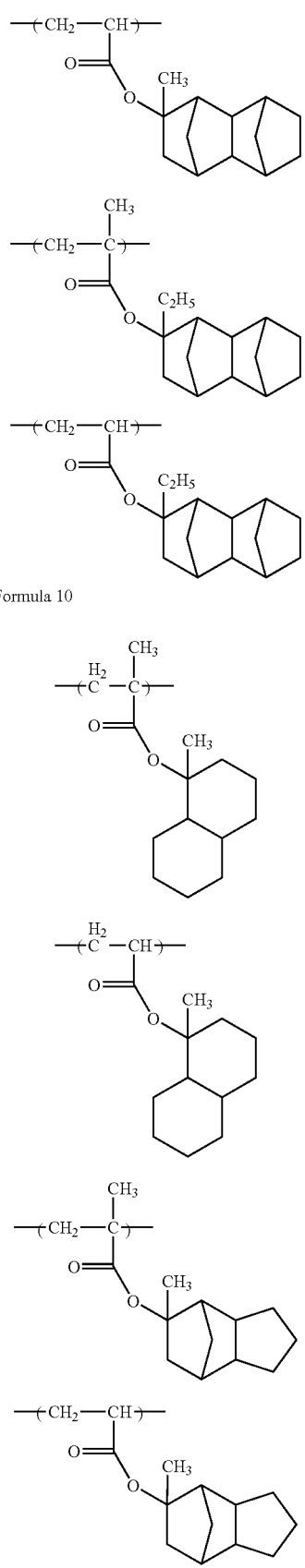

(a1-1-21) 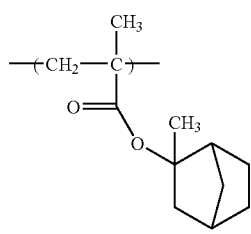
(a1-1-22) 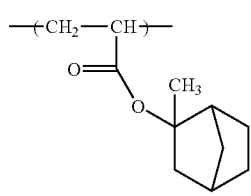
(a1-1-23) 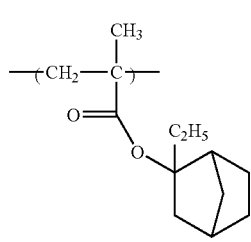
(a1-1-24) 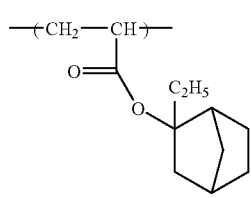
(a1-1-25) 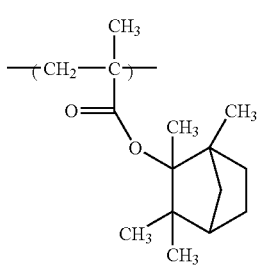
(a1-1-26) 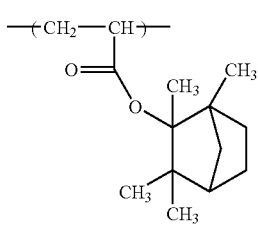
(a1-1-27) 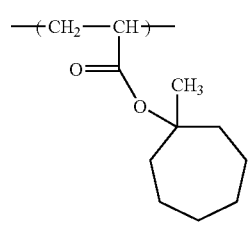
(a1-1-28) 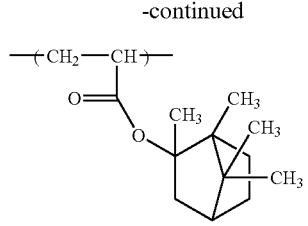
(a1-1-29) 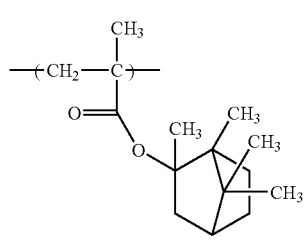
(a1-1-30) 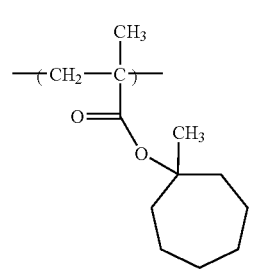
(a1-1-31) 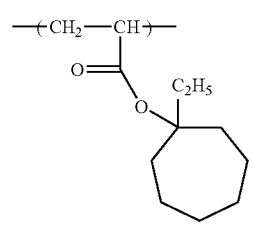
(a1-1-32) 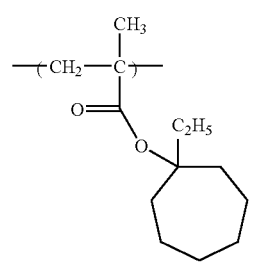
Chemical Formula 11
(a1-1-33) 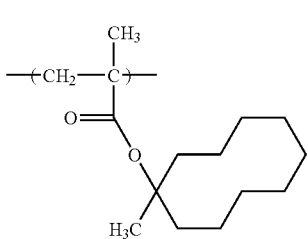

-continued
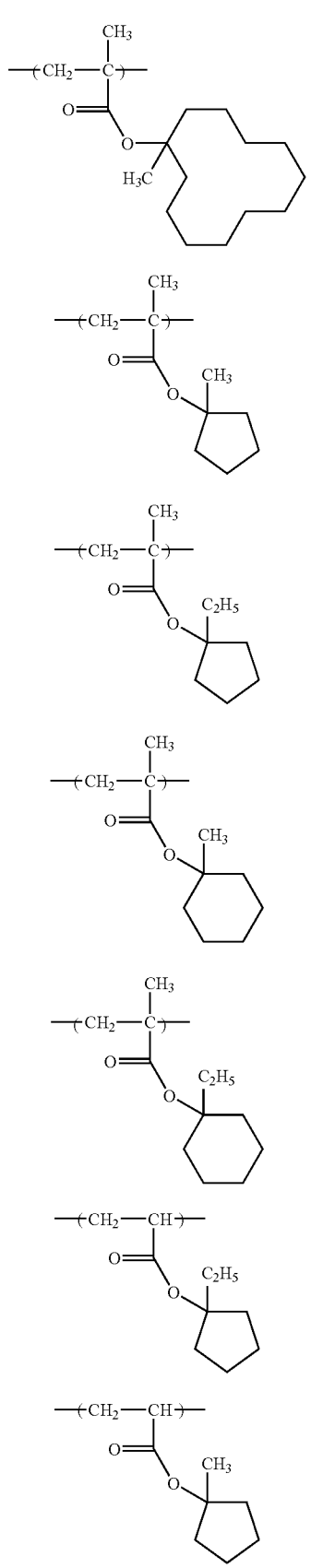
(a1-1-34)
(a1-1-35)
(a1-1-36)
(a1-1-37)
(a1-1-38)
(a1-1-39)
(a1-1-40)
-continued
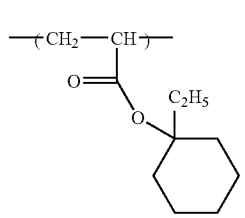
(a1-1-41)
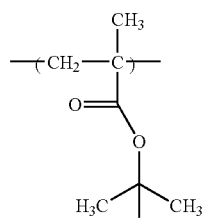
(a1-1-42)
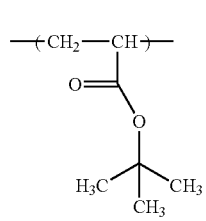
(a1-1-43)
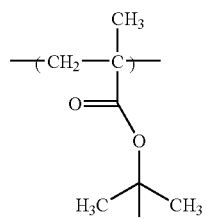
(a1-1-44)
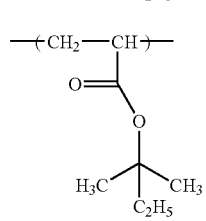
(a1-1-45)
Chemical Formula 12
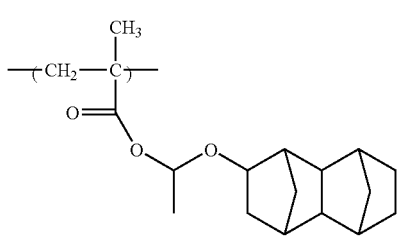
(a1-2-1)
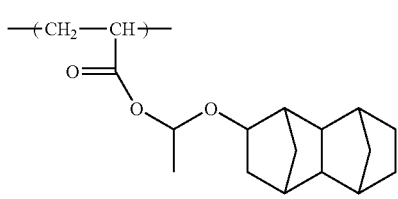
(a1-2-2)

-continued
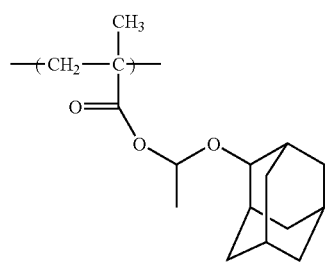
(a1-2-3)
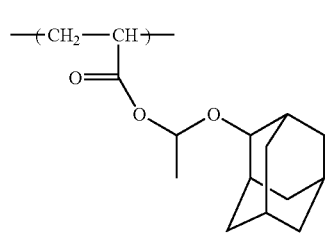
(a1-2-4)
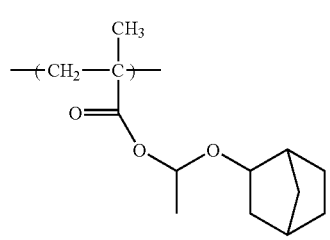
(a1-1-5)
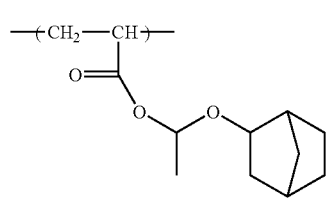
(a1-2-6)
Chemical Formula 13
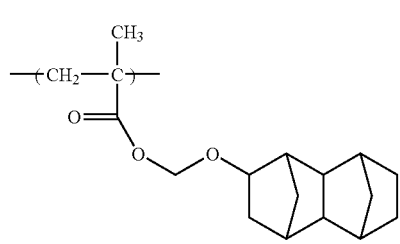
(a1-2-7)
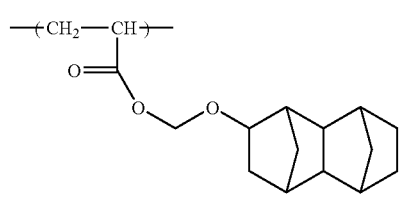
(a1-2-8)
-continued
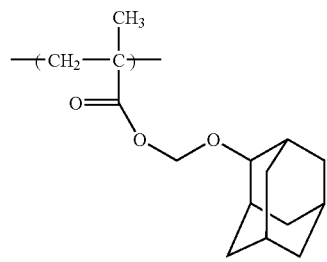
(a1-2-9)
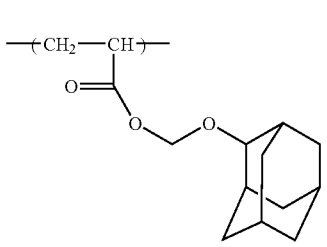
(a1-2-10)
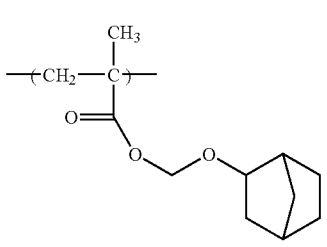
(a1-2-11)
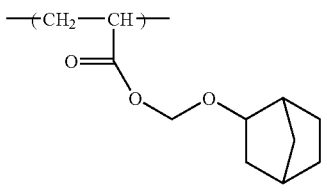
(a1-2-12)
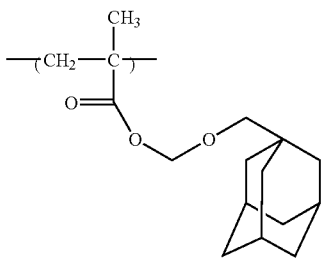
(a1-2-13)
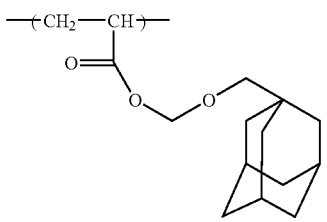
(a1-2-14)

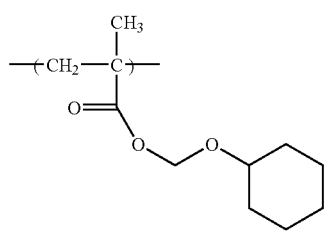
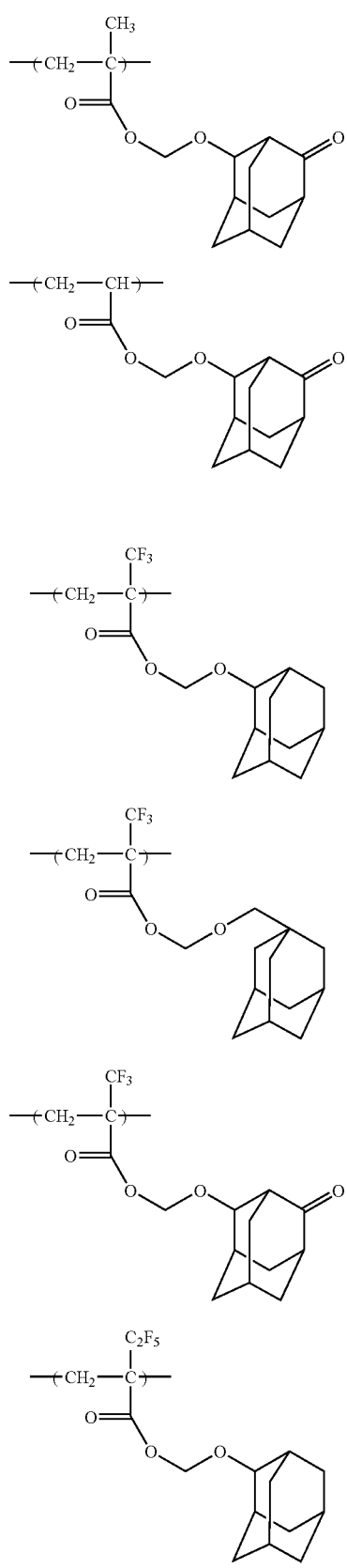

-continued
(a1-2-30)
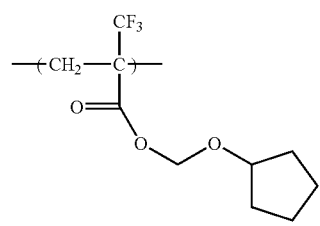
(a1-2-31)
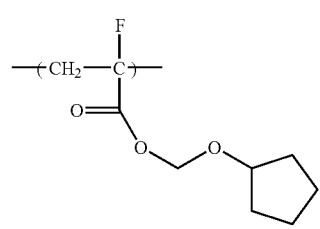
(a1-2-32)
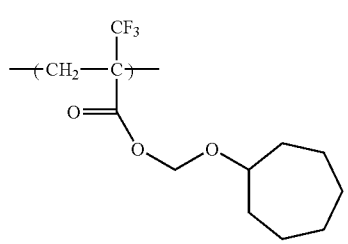
(a1-2-34)
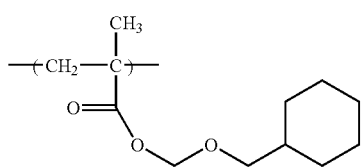
(a1-2-35)
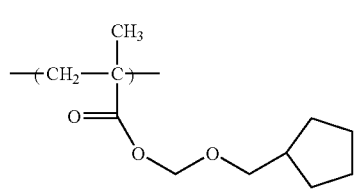
Chemical Formula 15
(a1-2-36)
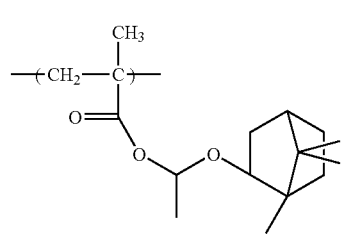
-continued
(a1-2-37)
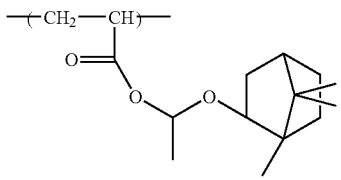
(a1-2-38)
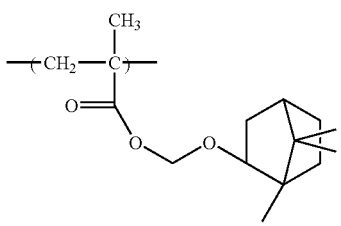
(a1-2-39)
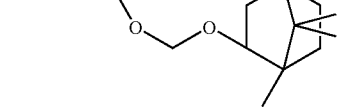
(a1-2-40)
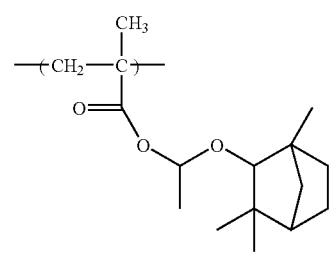
(a1-2-41)
(a1-2-42)
(a1-2-43)
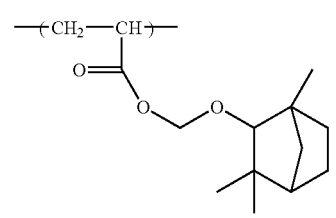

Chemical Formula 16
(a1-3-1) 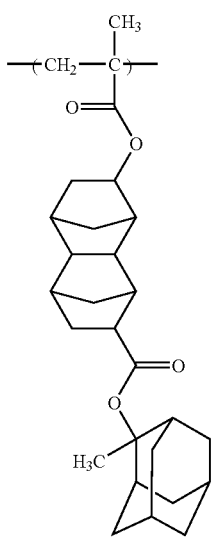
(a1-3-2) 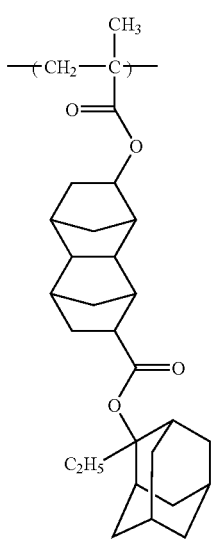
(a1-3-3) 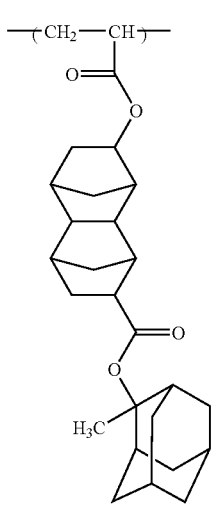
(a1-3-4) 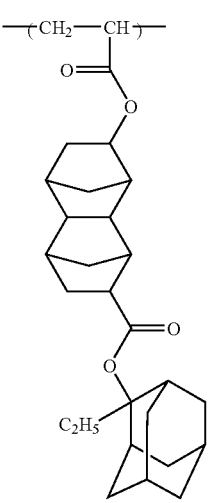
(a1-3-5) 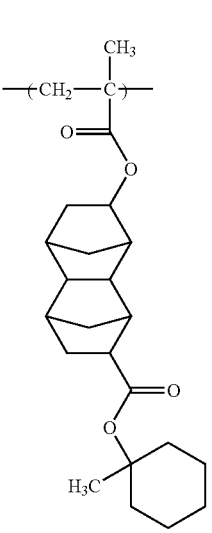
(a1-3-6) 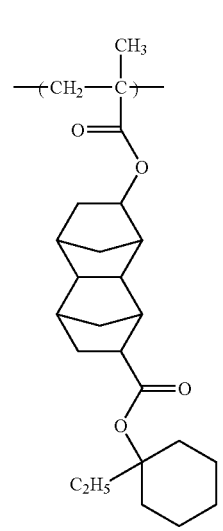

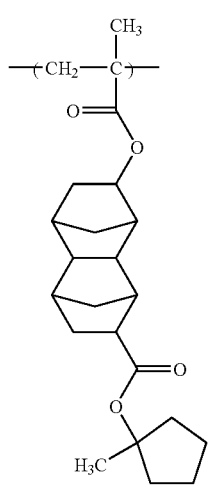
(a1-3-7)
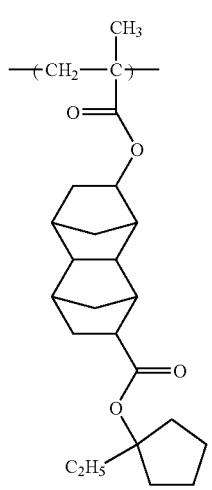
(a1-3-8)
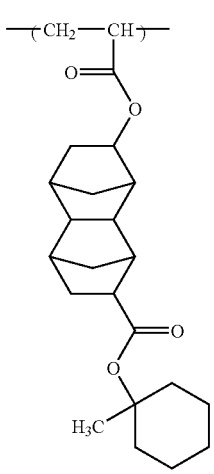
(a1-3-9)
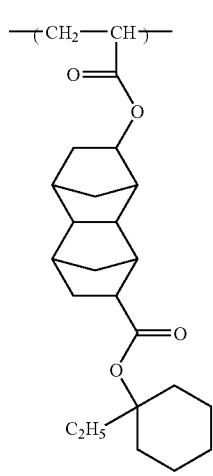
(a1-3-10)
(a1-3-11)
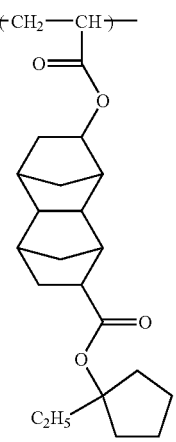
(a1-3-12)

Chemical Formula 17
(a1-3-13)
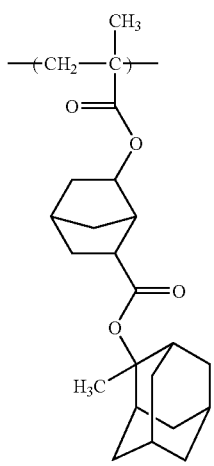
(a1-3-14)
(a1-3-15)
(a1-3-16)
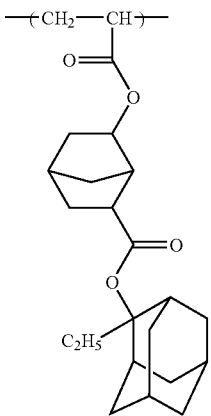
(a1-3-17)
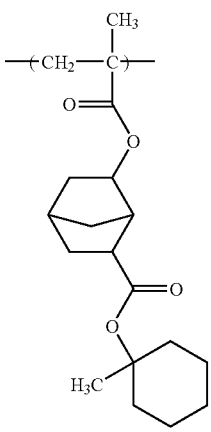
(a1-3-18)
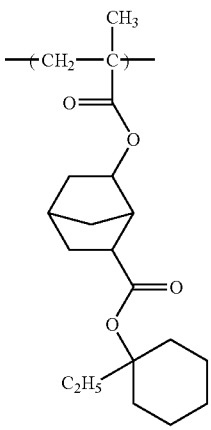

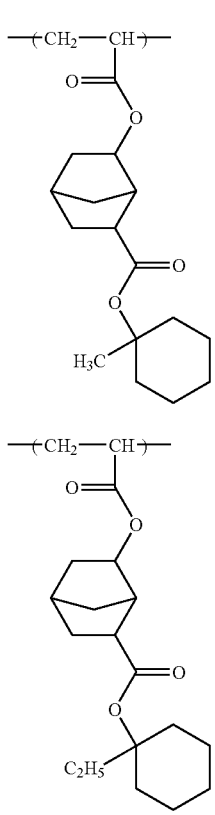 (a1-3-19)
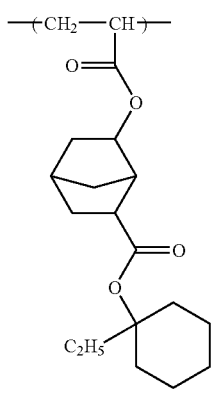 (a1-3-20)
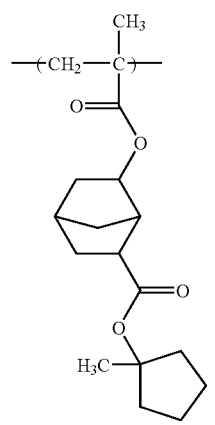 (a1-3-21)
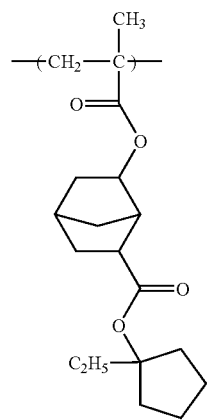 (a1-3-22)
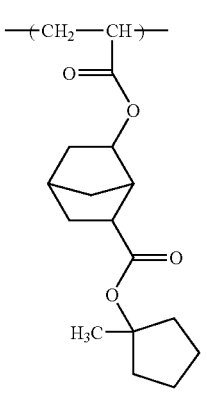 (a1-3-23)
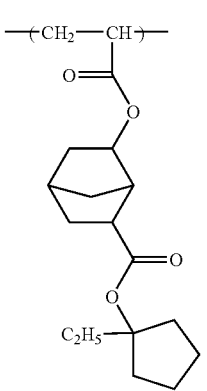 (a1-3-24)
Chemical Formula 18
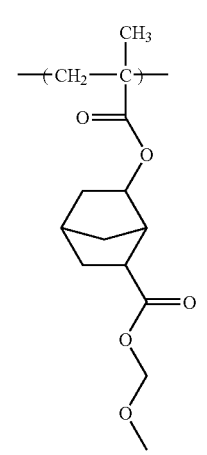 (a1-4-1)
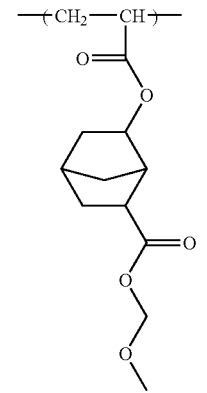 (a1-4-2)

-continued
(a1-4-3)
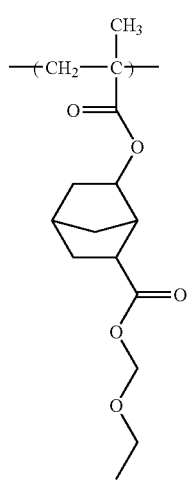
(a1-4-4)
(a1-4-5)
(a1-4-6)
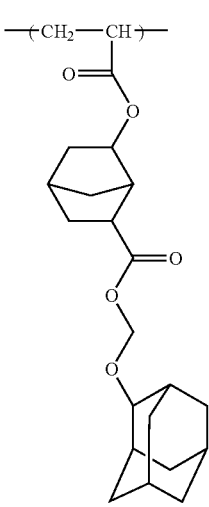
(a1-4-7)
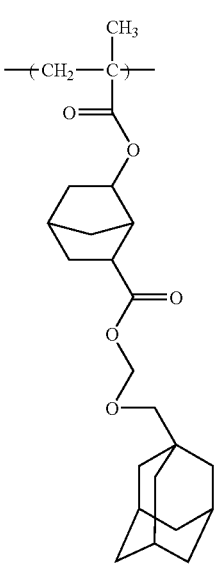
(a1-4-8)
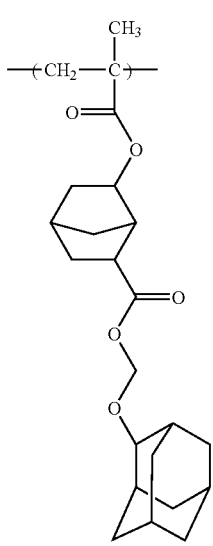

-continued
(a1-4-9)
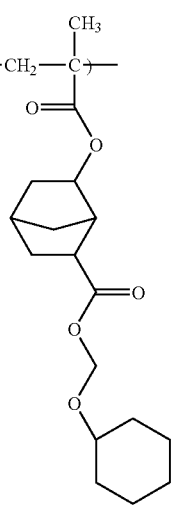
(a1-4-10)
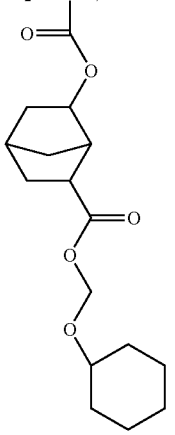
(a1-4-11)
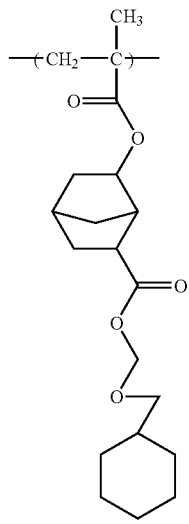
-continued
(a1-4-12)
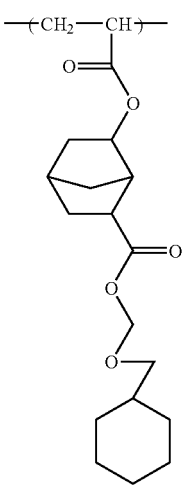
(a1-4-13)
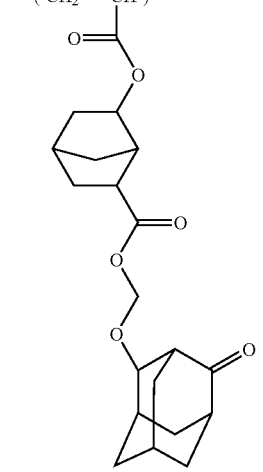
(a1-4-14)
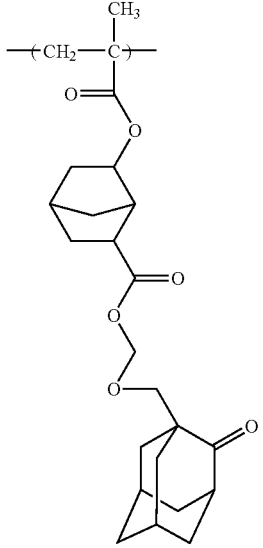

-continued
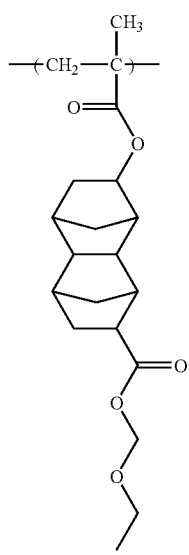
(a1-4-15)
Chemical Formula 19
(a1-4-16)
(a1-4-17)
(a1-4-18)
(a1-4-19)
(a1-4-20)

(a1-4-21)
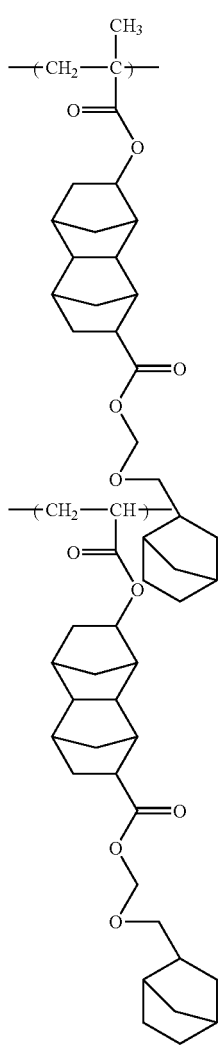
(a1-4-22)
(a1-4-23)
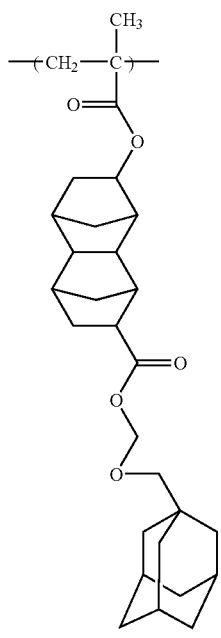
(a1-4-24)
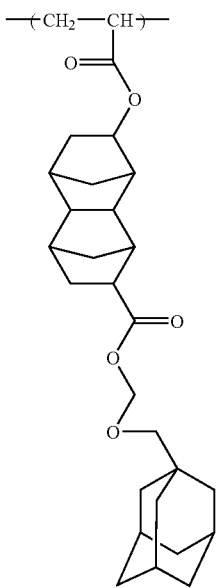
(a1-4-25)
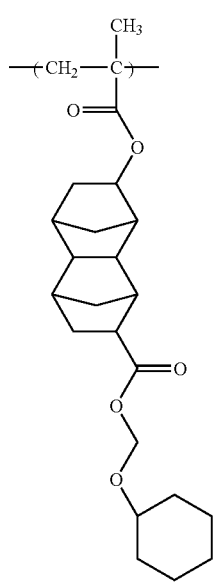
(a1-4-26)
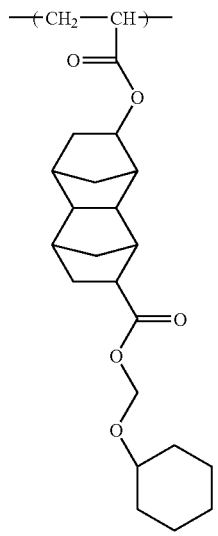

-continued (a1-4-27)

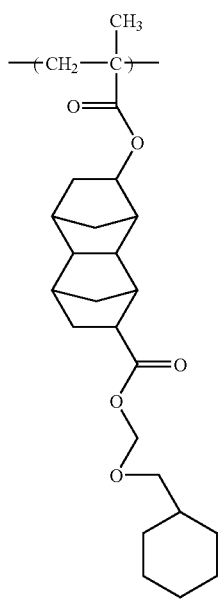

(a1-4-28)

(a1-4-29)

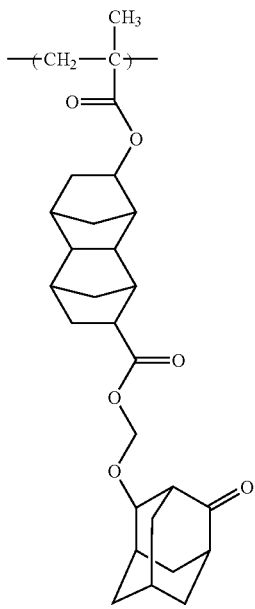

(a1-4-30)

The constituent unit (a1) may be used alone, or in a combination of two or more kinds thereof.

Among these, the constituent unit represented by the general formula (a1-1) is preferred, and specifically at least one selected from the constituent units represented by the general formulae (a1-1-1) to (a1-1-6), or (a1-1-35) to (a1-1-41) is more preferred.

Further, as the constituent unit (a1), a constituent unit represented by the following general formula (a1-1-01) which encompasses the constituent units represented by the formulae (a1-1-1) to (a1-1-4), or a constituent unit represented by the following general formula (a1-1-02) which encompasses the constituent units represented by the formulae (a1-1-35) to (a1-1-41) is also particularly preferred.

Chemical Formula 20

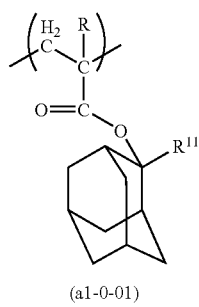

(a1-0-01)

wherein R represents a hydrogen atom, a halogen atom, a lower alkyl group, or a halogenated lower alkyl group, and $R^{11}$ represents a lower alkyl group.

Chemical Formula 21

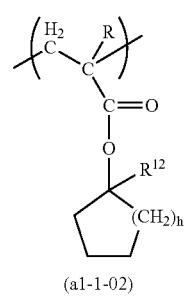

(a1-1-02)

wherein R represents a hydrogen atom, a halogen atom, a lower alkyl group, or a halogenated lower alkyl group, $R^{12}$ represents a lower alkyl group, and h represents an integer of 1 to 3.

In the general formula (a1-1-01), R is the same as defined above. The lower alkyl group of $R^{11}$ is the same as defined above for the lower alkyl group as R, and among these, a methyl group or an ethyl group is preferred.

In the general formula (a1-1-02), R is the same as defined above. The lower alkyl group of $R^{12}$ is the same as defined above for the lower alkyl group of R, and among these, a methyl group or an ethyl group is preferred, and an ethyl group is most preferred. h is preferably 1 or 2, and most preferably 2.

The proportion of the constituent unit (a1) in the component (A) is preferably 10 to 80% by mole, more preferably 20 to 70% by mole, and most preferably 25 to 50% by mole, based on the total amount of all the constituent units that constitute the component (A). If the proportion is no less than the lower limit, a pattern can be easily obtained when it is used for a resist composition. If the proportion is no more than the upper limit, a good balance with other constituent units can be attained.

Constituent Unit (a2)

The component (A) is preferably a component that contains a constituent unit derived from an acrylic acid ester (a2) containing a lactone-containing cyclic group, in addition to the above-described constituent unit (a1).

As used herein, the lactone-containing cyclic group refers to a cyclic group containing a ring (lactone ring) having an —O—C(O)— structure. Considering the lactone ring as one ring, if the structure has only a lactone ring, it corresponds to a monocyclic group. If the structure has other ring structures, it corresponds to a polycyclic group, irrespective of such structures.

The lactone cyclic group of the constituent unit (a2) is effective for enhancing adherence with a substrate of a resist film or affinity to a water-containing developer, in the case where the component (A) is used to form the resist film.

The constituent unit (a2) is not particularly limited, and any one can be used therefor.

Specific examples of the lactone-containing monocyclic group include a group in which one hydrogen atom has been removed from a ?-butyrolactone. In addition, examples of the lactone-containing polycyclic group include a group in which one hydrogen atom has been removed from bicycloalkane, tricycloalkane, or tetracycloalkane, containing a lactone ring.

More specific examples of the constituent unit (a2) include the constituent units represented by the following general formulae (a2-1) to (a2-5).

Chemical Formula 22

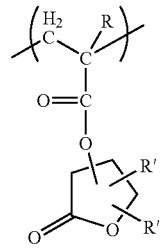
(a2-1)

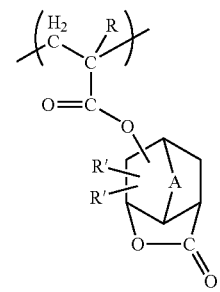
(a2-2)

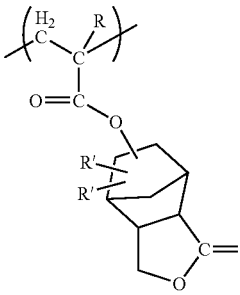
(a2-3)

-continued

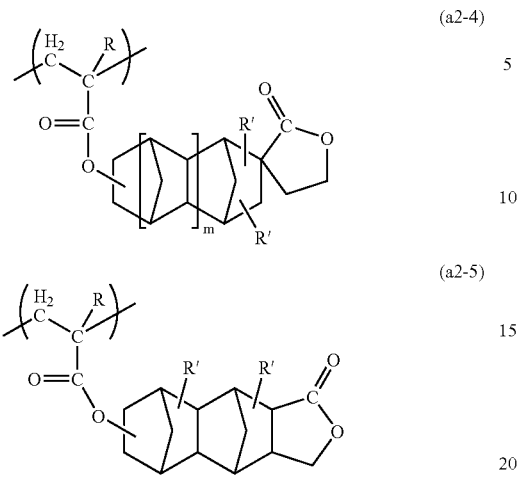

(a2-4)

(a2-5)

wherein R is a hydrogen atom, a halogen atom, a lower alkyl group, or a halogenated lower alkyl group, R' is a hydrogen atom, a lower alkyl group, or an alkoxy group having 1 to 5 carbon atoms, m is an integer of 0 or 1, and A is an alkylene group having 1 to 5 carbon atoms or an oxygen atom.

In the general formulae (a2-1) to (a2-5), R is the same as R in the constituent unit (a1).

The lower alkyl group of R' is the same as the lower alkyl group of R in the constituent unit (a1).

Specific examples of the alkylene group having 1 to 5 carbon atoms of A include a methylene group, an ethylene group, an n-propylene group, and an isopropylene group.

In the general formulae (a2-1) to (a2-5), as R', a hydrogen atom is preferred in terms of industrial availability.

Hereinbelow, specific examples of the constituent units represented by the general formulae (a2-1) to (a2-5) are shown.

Chemical Formula 23

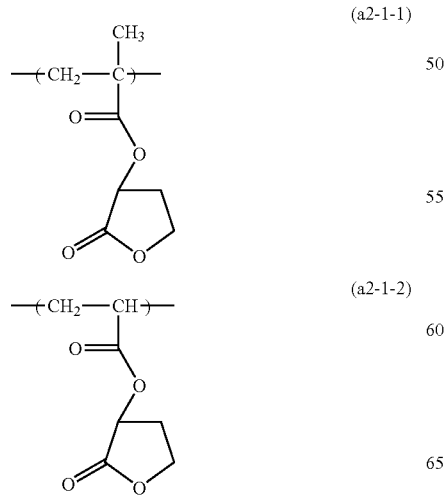

(a2-1-1)

(a2-1-2)

Chemical Formula 24

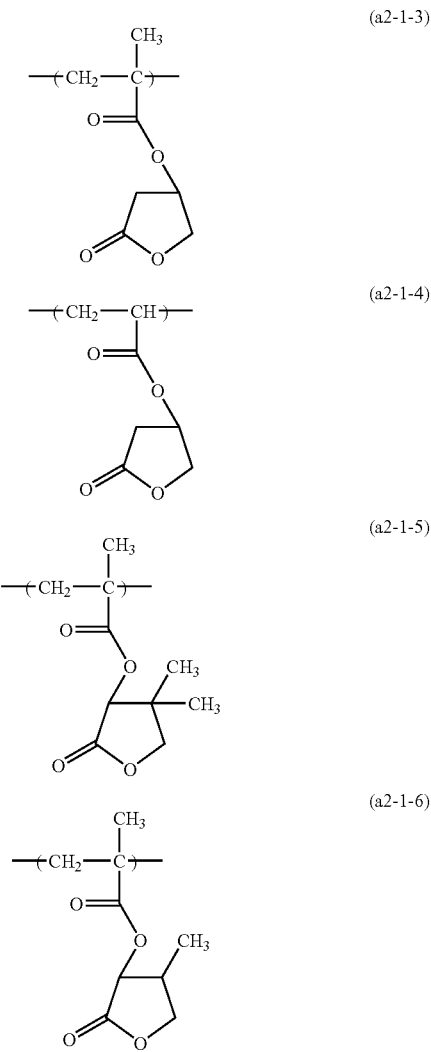

(a2-1-3)

(a2-1-4)

(a2-1-5)

(a2-1-6)

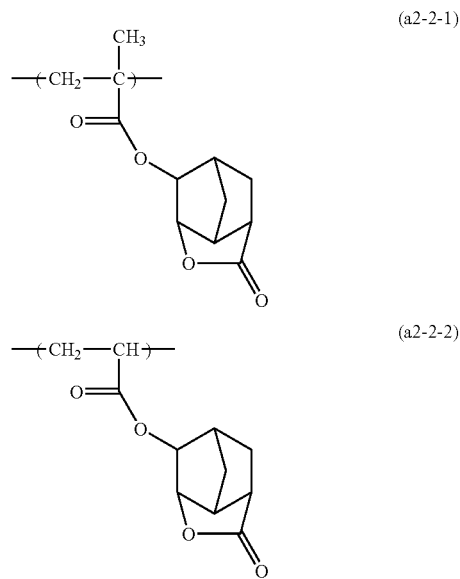

(a2-2-1)

(a2-2-2)

-continued
(a2-2-3)
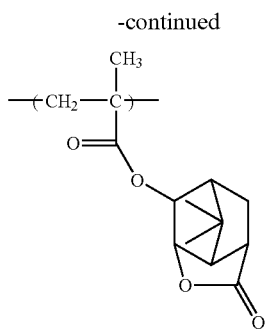
(a2-2-4)
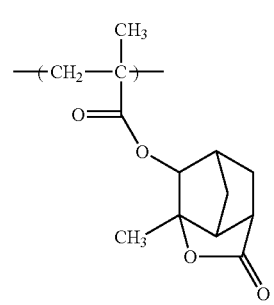
(a2-2-5)
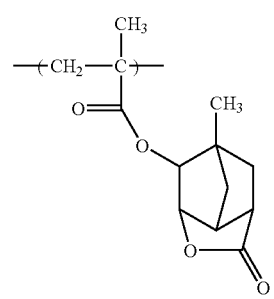
(a2-2-6)
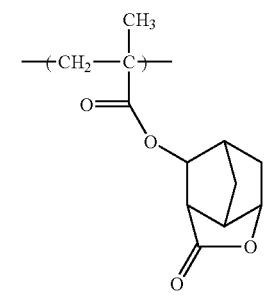
(a2-2-7)
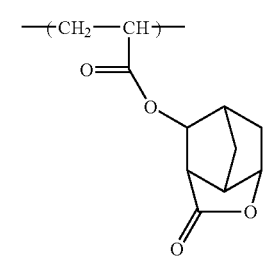
-continued
(a2-2-8)
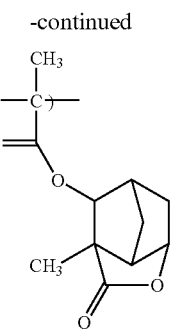
(a2-2-9)
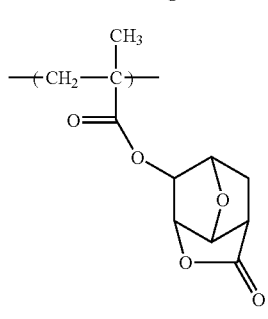
(a2-2-10)
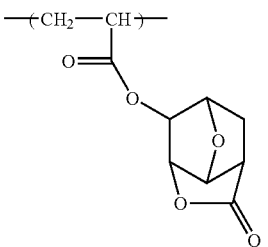
Chemical Formula 25
(a2-3-1)
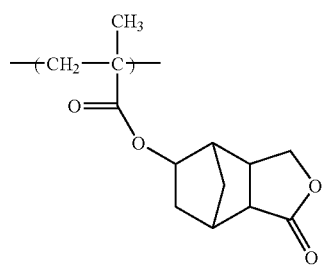
(a2-3-2)
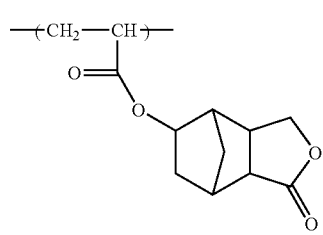
(a2-3-3)
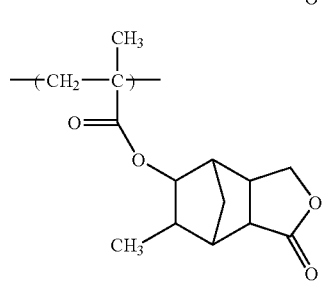

-continued
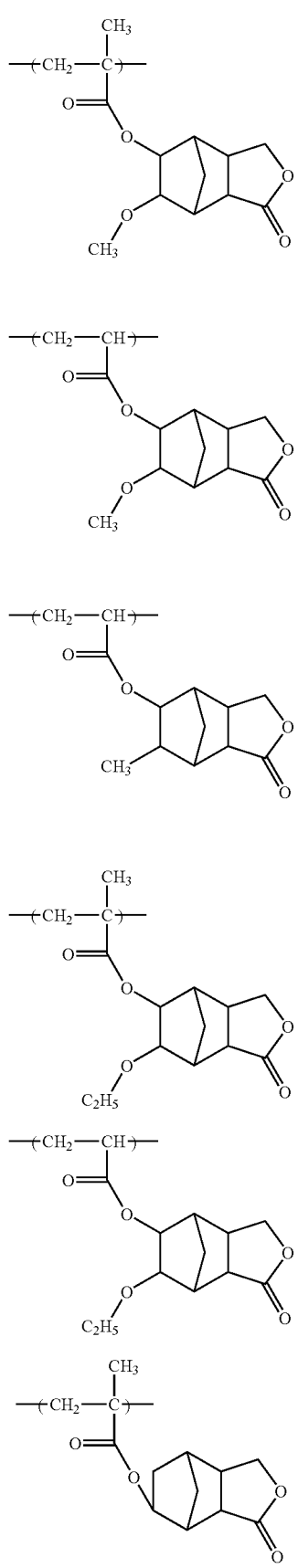
(a2-3-4)
(a2-3-5)
(a2-3-6)
(a2-3-7)
(a2-3-8)
(a2-3-9)
-continued
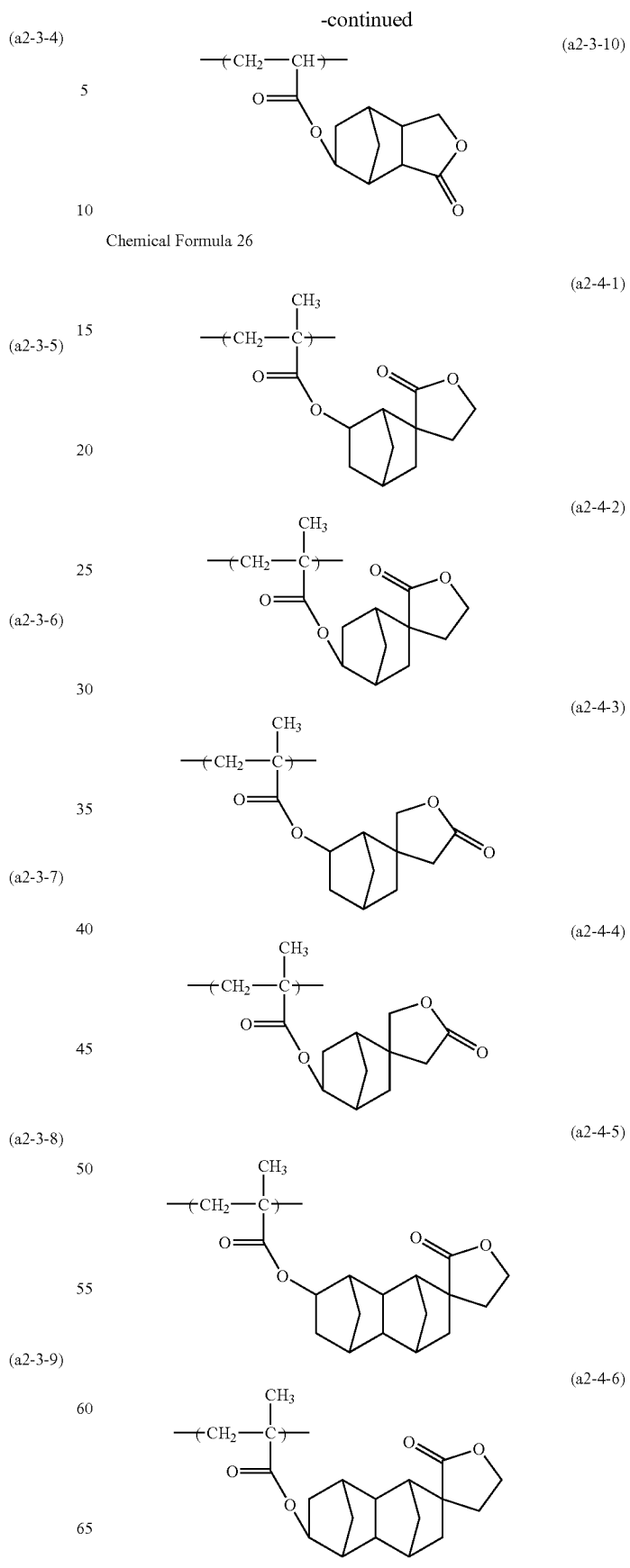
(a2-3-10)
Chemical Formula 26
(a2-4-1)
(a2-4-2)
(a2-4-3)
(a2-4-4)
(a2-4-5)
(a2-4-6)

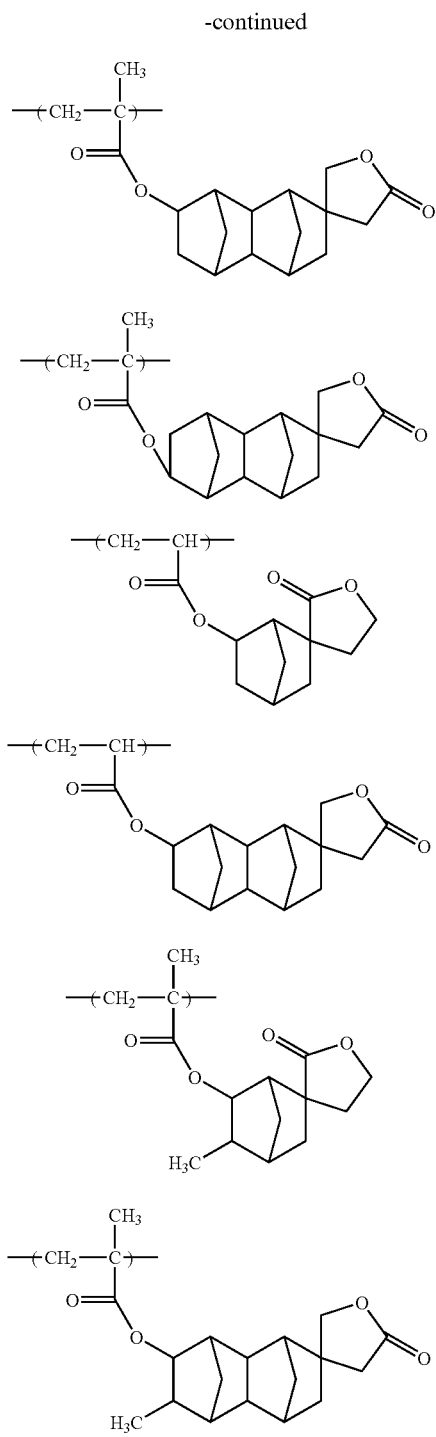
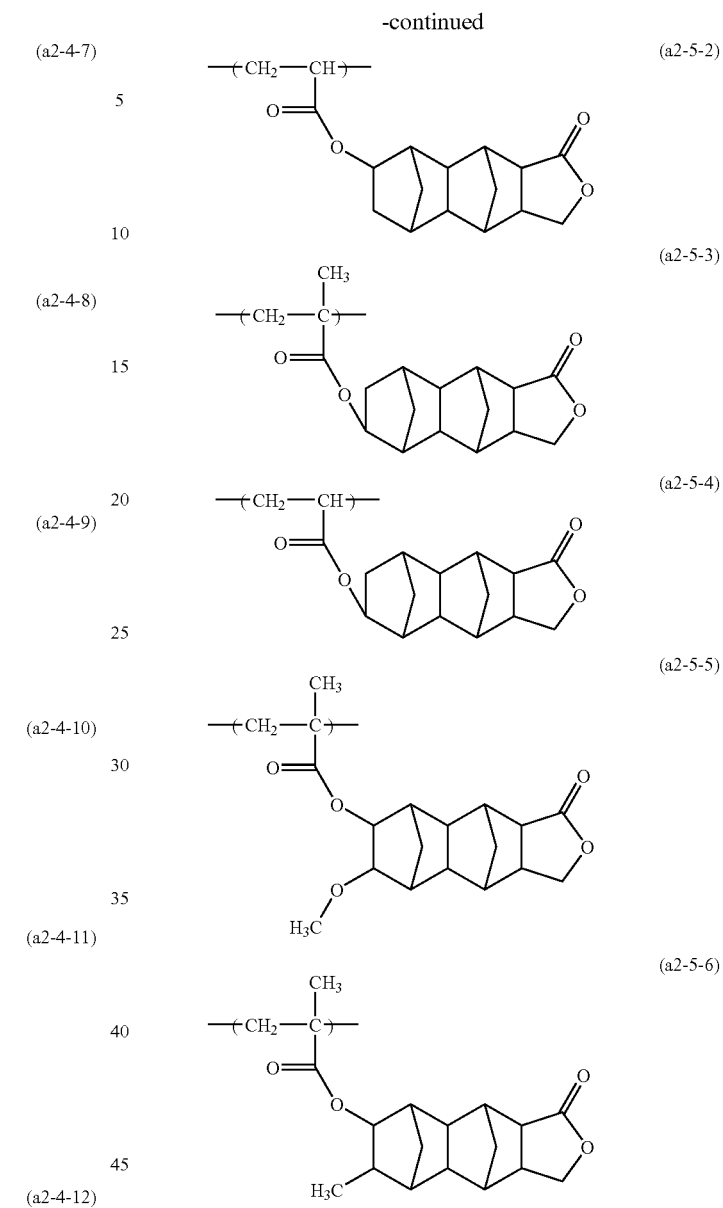

Among these, at least one selected from the constituent units represented by the general formulae (a2-1) to (a2-5) is preferably used, and at least one selected from the constituent units represented by the general formulae (a2-1) to (a2-3) is more preferably used. At least one selected from the constituent units represented by the chemical formulae (a2-1-1), (a2-1-2), (a2-2-1), (a2-2-2), (a2-3-1), (a2-3-2), (a2-3-9), and (a2-3-10) is particularly preferably used.

In the component (A), the constituent unit (a2) may be used alone, or in a combination of two or more kinds thereof.

The proportion of the constituent unit (a2) in the component (A) is preferably 5 to 60% by mole, more preferably 10 to 60% by mole, and most preferably 20 to 55% by mole, based on the total amount of all the constituent units that constitute the component (A). If the proportion is no less than the lower limit, the effect from the incorporation of the constituent unit (a2) can be sufficiently obtained. If the proportion is no more than the upper limit, a good balance with other constituent units can be attained.

Constituent Unit (a3)

The component (A) preferably further includes a constituent unit (a3) derived from an acrylic acid ester that contains a polar group-containing aliphatic hydrocarbon group, in addition to the above-described constituent unit (a1), or in addition to the above-described constituent units (a1) and (a2). By incorporating the constituent unit (a3), the hydrophilicity of the component (A) is increased, and the affinity to a developer is also increased, which improves the alkali solubility of an exposed area, and contributes to the improvement of resolution.

Examples of the polar group include a hydroxyl group, a cyano group, a carboxyl group, and a hydroxyalkyl group in which a part of hydrogen atoms of the alkyl group have been substituted with fluorine atoms, and among these, a hydroxyl group is particularly preferred.

Examples of the aliphatic hydrocarbon group include a straight-chained or branched hydrocarbon group having 1 to 10 carbon atoms (preferably an alkylene group), or a polycyclic aliphatic hydrocarbon group (a polycyclic group). As the polycyclic group, for example, any one that is suitably selected from a plurality of components that have been suggested as a resin for a resist composition for an ArF excimer laser can be used. The polycyclic group preferably has 7 to 30 carbon atoms.

Among these, more preferred is a constituent unit derived from an acrylic acid ester containing an aliphatic polycyclic group that contains a hydroxyl group, a cyano group, a carboxyl group, or a hydroxyalkyl group in which a part of hydrogen atoms of an alkyl group have been substituted with fluorine atoms. Examples of the polycyclic group include a group in which at least one hydrogen atom has been removed from bicycloalkane, tricycloalkane, tetracycloalkane, and the like. Specific examples thereof include a group in which at least one hydrogen atom has been removed from a polycycloalkane such as adamantane, norbornane, isobornane, tricyclodecane, and tetracyclododecane. Among these polycyclic groups, a group in which at least two hydrogen atoms have been removed from adamantane, a group in which at least two hydrogen atoms have been removed from norbornane, and a group in which at least two hydrogen atoms have been removed from tetracyclododecane are preferred, from an industrial viewpoint.

As the constituent unit (a3), in the case where the hydrocarbon group of the polar group-containing aliphatic hydrocarbon group is a straight-chained or branched hydrocarbon croup having 1 to 10 carbon atoms, a constituent unit derived from a hydroxyethylester of an acrylic acid is preferred. Further, in the case where the hydrocarbon group is a polycyclic group, for example, the constituent units represented by the following formulae (a3-1), (a3-2), and (a3-3) are preferably exemplified.

Chemical Formula 28

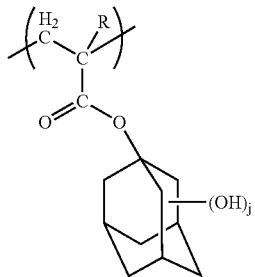
(a3-1)

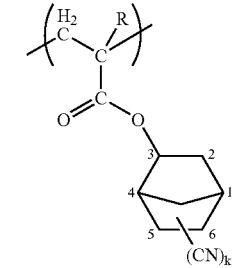
(a3-2)

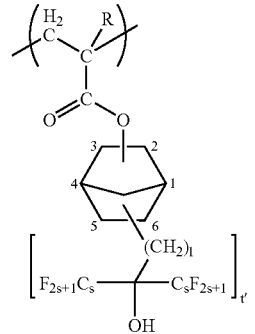
(a3-3)

wherein R is the same as defined above, j is an integer of 1 to 3, k is an integer of 1 to 3, t' is an integer of 1 to 3, l is an integer of 1 to 5, and s is an integer of 1 to 3.

In the formula (a3-1), j is preferably 1 or 2, and more preferably 1. If j is 2, a hydroxyl group is preferably bonded at 3- and 5-positions of the adamantyl group. If j is 1, a hydroxyl group is preferably bonded at a 3-position of the adamantyl group. j is preferably 1, and the hydroxyl group is particularly preferably bonded at a 3-position of the adamantyl group.

In the formula (a3-2), k is preferably 1. The cyano group is preferably bonded at a 5- or 6-position of the norbornyl group.

In the formula (a3-3), t' is preferably 1. l is preferably 1. s is preferably 1. Here, a 2-norbornyl group or a 3-norbornyl group is preferably bonded on a terminal of the carboxyl group of an acrylic acid. A fluorinated alkyl alcohol is preferably bonded at a 5- or 6-position of the norbornyl group.

The constituent unit (a3) may be used alone, or in a combination of two or more kinds thereof.

The proportion of the constituent unit (a3) in the component (A) is preferably 5 to 50% by mole, more preferably 5 to 40% by mole, and still more preferably 5 to 25% by mole, based on the total amount of all the constituent units that constitute the component (A).

Constituent Unit (a4)

The component (A) may further include a constituent unit (a4), in addition to the above-described constituent units (a1) to (a3), within the range that does not interfere with the effects of the present invention.

The constituent unit (a4) is not particularly limited, as long as it is not classified into the constituent units (a1) to (a3). Thus, as the component (A), any one selected from a plurality of components that have been suggested to be used as a resin for a resist for an ArF excimer laser, and a resist composition for a KrF excimer laser, and the like (preferably for an ArF excimer laser), can be used.

As the constituent unit (a4), for example, a constituent unit derived from an acrylic acid ester containing an acid-undissociable aliphatic polycyclic group is preferred. Examples of the polycyclic group are the same as those mentioned in the case of the constituent unit (a1), and any one selected from a plurality of components that have been suggested to be used as a resin component of a resist composition for an ArF excimer laser, and a resist composition for a KrF excimer laser, and the like (preferably for an ArF excimer laser), can be used.

Particularly, at least one selected from a tricyclodecanyl group, an adamantyl group, a tetracyclododecanyl group, an isobornyl group, and a norbornyl group is preferred, in terms of industrial availability, etc. Each of these polycyclic groups may have a straight-chained or branched alkyl group having 1 to 5 carbon atoms as a substituent.

Specific examples of the constituent unit (a4) include those having the structures represented by the following general formulae (a4-1) to (a4-5).

Chemical Formula 29

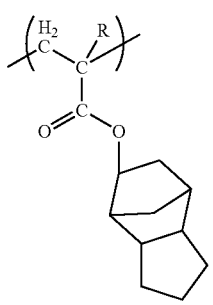

(a4-1)

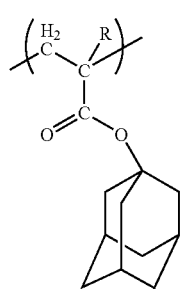

(a4-2)

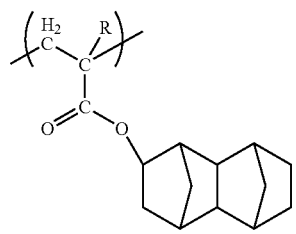

(a4-3)

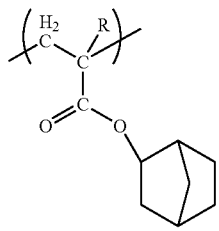

(a4-4)

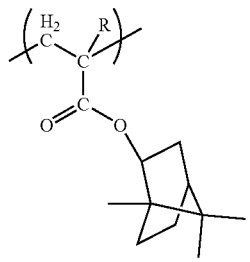

(a4-5)

wherein R is the same as defined above.

When the constituent unit (a4) is contained in the component (A), it is contained in an amount of preferably 1 to 30% by mole, and more preferably 10 to 20% by mole, based on the total amount of all the constituent units that constitute the component (A).

In the present invention, the component (A) is a copolymer including the constituent units (a1), (a2), and (a3). Examples of such a copolymer include a copolymer including the constituent units (a1), (a2), and (a3), and a copolymer including the constituent units (a1), (a2), (a3), and (a4).

As the component (A), particularly a copolymer including three kinds of the constituent units, each represented by the following general formula (A-11), is preferred.

Chemical Formula 30

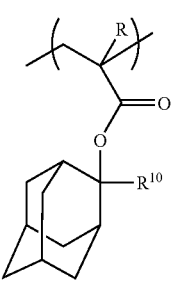

(A-11)

-continued

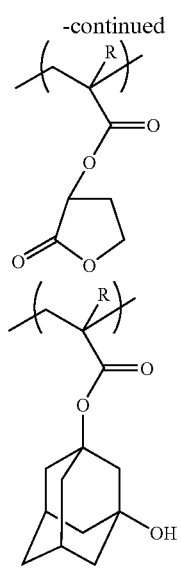

In the formula (A1-11), R is the same as defined above, and $R^{10}$ is a lower alkyl group.

The lower alkyl group of $R^{10}$ is the same as the lower alkyl group of R, and among these, a methyl group or an ethyl group is preferred, and a methyl group is most preferred.

The component (A) can be obtained by polymerization of monomers that derive each of the constituent units, using a known radical polymerization process, etc. by means of a radical polymerization initiator such as azobisisobutyronitrile and dimethyl-2,2-azobis(isobutylate).

Furthermore, in the component (A), a —C(CF$_3$)$_2$—OH group can be introduced to a terminal by using a chain transfer agent such as HS—CH$_2$—CH$_2$—CH$_2$—C(CF$_3$)$_2$—OH during polymerization. As such, the copolymer, to which a hydroxyalkyl group that a part of the hydrogen atoms of an alkyl group have been substituted with fluorine atoms is introduced, is effective for reduction of development defects or reduction of line edge roughness (LER; uneven roughness on the side wall surface of the line).

The mass average molecular mass (Mw) of the component (A) (as measured by gel permeation chromatography, in terms of polystyrene) is not particularly limited, but it is preferably 2000 to 50000, more preferably 3000 to 30000, and most preferably 5000 to 20000.

If the mass average molecular mass is less than the upper limit, sufficient solubility in a resist solvent which allows the component to be used as a resist is obtained. If the mass average molecular mass is more than the lower limit, dry etching resistance or the cross-sectional shape of a resist pattern is good.

Further, the dispersibility (Mw/Mn) is preferably 1.0 to 5.0, more preferably 1.0 to 3.0, and most preferably 1.2 to 2.5. Mn refers to a number average molecular mass.

Component (B)

Component (B) is not particularly limited, and as the component (B), any one selected from components that have been suggested as an acid generator for a chemically amplified resist can be used. As the acid generator, there have been conventionally known a plurality of an acid generator such as an onium salt-based acid generator such as an iodonium salt and a sulfonium salt; an oxime sulfonate-based acid generator; a diazomethane-based acid generator such as bisalkyl or bisaryl sulfonyl diazomethanes, and poly(bisulfonyl) diazomethanes; a nitrobenzyl sulfonate-based acid generator; an iminosulfonate-based acid generator; and a disulfone-based acid generator.

Examples of the onium salt-based acid generator include a compound represented by the following general formula (b-0).

Chemical Formula 31

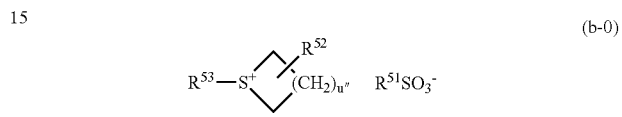

(b-0)

wherein $R^{51}$ represents a straight-chained, branched or cyclic alkyl group, or a straight-chained, branched or cyclic fluorinated alkyl group; $R^{52}$ represents a hydrogen atom, a hydroxyl group, a halogen atom, a straight-chained or branched alkyl group, a straight-chained or branched halogenated alkyl group, or a straight-chained or branched alkoxy group; $R^{53}$ represents an aryl group that may have a substituent; and u" represents an integer of 1 to 3.

In the general formula (b-0), $R^{51}$ represents a straight-chained, branched or cyclic alkyl group, or a straight-chained, branched or cyclic fluorinated alkyl group.

The straight-chained or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination rate of the fluorinated alkyl group (the proportion of the fluorine atoms in the alkyl group) is preferably 10 to 100%, more preferably 50 to 100%, and particularly those in which all of the hydrogen atoms have been substituted with fluorine atoms, thus giving strong acidity, are preferred.

$R^{51}$ is most preferably a straight-chained alkyl group or a fluorinated alkyl group.

$R^{52}$ is a hydrogen atom, a hydroxyl group, a halogen atom, a straight-chained or branched alkyl group, a straight-chained or branched halogenated alkyl group, or a straight-chained or branched alkoxy group.

Examples of the halogen atom as $R^{52}$ include a fluorine atom, a bromine atom, a chlorine atom, and an iodine atom, and among these, a fluorine atom is preferred.

The alkyl group as $R^{52}$ is straight-chained or branched, and preferably has 1 to 5 carbon atoms, more preferably 1 to 4 carbon atoms, and still more preferably 1 to 3 carbon atoms.

The halogenated alkyl group as $R^{52}$ is a group in which a part or all of the hydrogen atoms of the alkyl group have been substituted with fluorine atoms. Here, examples of the alkyl group include the same "alkyl groups" mentioned above as $R^{52}$. Examples of the substituting halogen atoms include the same as those mentioned above in the description of the "halogen atom". For the halogenated alkyl group, it is preferable that 50 to 100% of the total hydrogen atoms be substituted with halogen atoms, and it is more preferable that 100% of the total hydrogen atoms be substituted with halogen atoms.

The alkoxy group as $R^{52}$ is straight-chained or branched, and preferably it has 1 to 5 carbon atoms, more preferably 1 to 4 carbon atoms, and still more preferably 1 to 3 carbon atoms.

Among these, a hydrogen atom is preferred as $R^{52}$.

$R^{53}$ is an aryl group that may have a substituent, and examples of the structure of its basic ring in which the substituent is excluded include a naphthyl group, a phenyl group, and an anthracenyl group, and among these, a phenyl group is preferred, from the viewpoints of the effect of the present invention, or absorption of exposure light of an ArF excimer laser, etc.

Examples of the substituent include a hydroxyl group, and a lower alkyl group (which is straight-chained or branched, and preferably has 5 or less carbon atoms, and among these, a methyl group is particularly preferred).

The aryl group of $R^{53}$ further preferably has no substituent.

u" is an integer of 1 to 3, preferably 2 or 3, and particularly preferably 3.

Preferable examples of the acid generator represented by the general formula (b-0) are as follows.

Chemical Formula 32

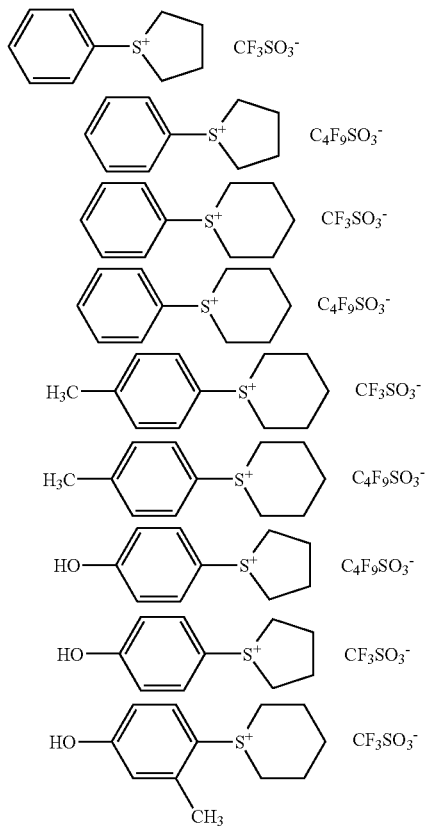

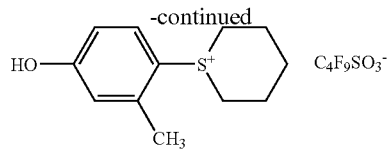

Further, examples of other onium salt-based acid generators as the acid generator represented by the general formula (b-0) include the compound represented by the following general formula (b-1) or (b-2).

Chemical Formula 33

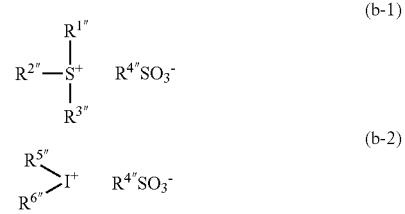

wherein $R^{1''}$ to $R^{3''}$, and $R^{5''}$ to $R^{6''}$ each independently represents an aryl group or an alkyl group; $R^{4''}$ represents a straight-chained, branched or cyclic alkyl group, or a fluorinated alkyl group; at least one of $R^{1''}$ to $R^{3''}$ represents an aryl group; and at least of $R^{5''}$ to $R^{6''}$ represents an aryl group.

In the formula (b-1), $R^{1''}$ to $R^{3''}$ each independently represents an aryl group or an alkyl group. At least one of $R^{1''}$ to $R^{3''}$ represents an aryl group. It is preferable that at least two of $R^{1''}$ to $R^{3''}$ be aryl groups, and it is most preferable that all of $R^{1''}$ to $R^{3''}$ be aryl groups.

The aryl groups of $R^{1''}$ to $R^{3''}$ are not particularly limited, and examples thereof include an aryl group having 6 to 20 carbon atoms. In the aryl group, a part of all of the hydrogen atoms may or may not be substituted with an alkyl group, an alkoxy group, a halogen atom, etc. As the aryl group, an aryl group having 6 to 10 carbon atoms is preferred, in view of inexpensive synthesis. Specific examples thereof include a phenyl group, and a naphthyl group.

As the alkyl group that may substitute the hydrogen atom of the aryl group, an alkyl group having 1 to 5 carbon atoms is preferred, and a methyl group, an ethyl group, a propyl group, an n-butyl group, or a tert-butyl group is most preferred.

As the alkoxy group that may substitute the hydrogen atom of the aryl group, an alkoxy group having 1 to 5 carbon atoms is preferred, and a methoxy group or an ethoxy group is most preferred.

As the halogen atom that may substitute the hydrogen atom of the aryl group, a fluorine atom is preferred.

The alkyl group of $R^{3''}$ to $R^{3''}$ is not particularly limited, and examples thereof include a straight-chained, branched or cyclic alkyl group having 1 to 10 carbon atoms.

It is preferable that the alkyl group have 1 to 5 carbon atoms, in view of excellent resolution. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and among these, a methyl group is preferred, in view of excellent resolution and inexpensive synthesis.

Among these, it is most preferred that each of $R^{1\prime\prime}$ to $R^{3\prime\prime}$ be a phenyl group or a naphthyl group.

$R^{4\prime\prime}$ represents a straight-chained, branched or cyclic alkyl group or fluorinated alkyl group.

The straight-chained or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination rate of the fluorinated alkyl group (the proportion of the fluorine atoms in the alkyl group) is preferably 10 to 100%, still more preferably 50 to 100%, and particularly those in which all of the hydrogen atoms have been substituted with fluorine atoms, thus giving strong acidity, are preferred.

As $R^{4\prime\prime}$, a straight-chained or cyclic alkyl group, or a fluorinated alkyl group is most preferred.

In the formula (b-2), $R^{5\prime\prime}$ to $R^{6\prime\prime}$ each independently represents an aryl group or an alkyl group. At least one of $R^{5\prime\prime}$ to $R^{6\prime\prime}$ represents an aryl group. Preferably, all of $R^{5\prime\prime}$ to $R^{6\prime\prime}$ are aryl groups.

Examples of the aryl group of $R^{5\prime\prime}$ to $R^{6\prime\prime}$ include the same as those mentioned for the aryl group of $R^{1\prime\prime}$ to $R^{3\prime\prime}$.

Examples of the alkyl group of $R^{5\prime\prime}$ to $R^{6\prime\prime}$ include the same as those mentioned for the alkyl group of $R^{1\prime\prime}$ to $R^{3\prime\prime}$.

Among these, it is most preferable that all of $R^{5\prime\prime}$ to $R^{6\prime\prime}$ be phenyl groups.

Examples of $R^{4\prime\prime}$ in the formula (b-2) include the same as those mentioned for $R^{4\prime\prime}$ in the formula (b-1).

Specific examples of the onium salt-based acid generator represented by the formula (b-1) or (b-2) include diphenyliodonium trifluoromethanesulfonate or nonafluorobutanesulfonate, bis(4-tert-butylphenyl) iodonium trifluoromethanesulfonate or nonafluorobutanesulfonate, triphenylsulfonium trifluoromethanesulfonate, heptafluoropropanesulfonate or nafluorobutanesulfonate, tri(4-methylphenyl) sulfonium trifluoromethanesulfonate, heptafluoropropanesulfonate or nonafluorobutanesulfonate, dimethyl(4-hydroxynaphthyl) sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methyl phenyl) diphenylsulfonium trifluoromethanesulfonate, heptafluoropropanesulfonate or nonafluorobutanesulfonate, (4-methoxyphenyl) diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl) sulfonium trifluoromethanesulfonate, heptafluoropropanesulfonate or nonafluorobutanesulfonate, di(1-naphthyl) phenylsulfonium trifluoromethanesulfonate, heptafluoropropanesulfonate or nonafluorobutanesulfonate, and the like. Also, the onium salts in which the anionic part has been substituted with methanesulfonate, n-propanesulfonate, n-butanesulfonate, or n-octanesulfonate can be used.

Further, in the general formula (b-1) or (b-2), the onium salt-based acid generator in which in the anionic part has been substituted with the anionic part represented by the following general formula (b-3) or (b-4) can also be used (the cationic part is the same as for (b-1) or (b-2)).

Chemical Formula 34

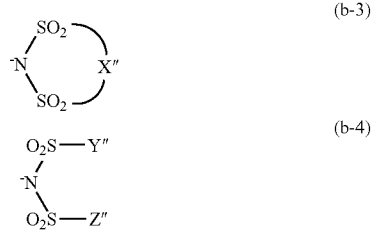

wherein X" represents an alkylene group having 2 to 6 carbon atoms in which at least one hydrogen atom has been substituted with a fluorine atom; and Y" and Z" each independently represents an alkyl group having 1 to 10 carbon atoms in which at least one hydrogen atom has been substituted with a fluorine atom.

X" is a straight-chain or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" are each independently a straight-chain or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

It is preferable that the alkylene group of X", or of the alkyl group of Y" and Z" have a smaller number of carbon atoms within the above-described range, in view of good solubility in a resist solvent.

Further, it is preferable that the alkylene group of X", or the alkyl group of Y" and Z" have a that larger number of the hydrogen atoms substituted with fluorine atoms in view of stronger acidity, and higher transparency to an electron beam or a high-energy light at 200 nm n or less. The proportion of the fluorine atoms in the alkylene group or alkyl group, that is, the fluorination rate is preferably 70 to 100%, still more preferably 90 to 100%, and a perfluoroalkylene group or perfluoroalkyl group in which all of the hydrogen atoms are substituted with fluorine atoms, is particularly preferred.

As used in the present invention, the oxime sulfonate-based acid generator is a compound having at least one group represented by the following general formula (B-1), which is characterized by generation of an acid upon irradiation with radiation. The oxime sulfonate-based acid generator is widely used for a chemically amplified resist composition, and thus can be optionally selected and used.

Chemical Formula 35

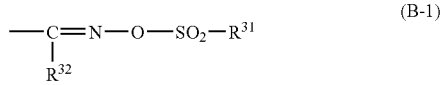

wherein $R^{31}$ and $R^{32}$ each independently represents an organic group.

The organic group of $R^{31}$ and $R^{32}$ is a carbon atom-containing group, and may contain atoms other than the carbon atom (for example, a hydrogen atom, an oxygen atom, a nitrogen atom, a sulfur atom, and a halogen atom (such as a fluorine atom, and a chlorine atom)).

The organic group of $R^{31}$ is preferably a straight-chained, branched, or cyclic alkyl group or an aryl group. The alkyl group or the aryl group may have a substituent. The substituent is not particularly limited, and examples thereof include a fluorine atom, and a straight-chained, branched, or cyclic alkyl group having 1 to 6 carbon atoms. As used herein, the expression "having a substituent" means that a part or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. The alkyl group is particularly preferably a partially or completely halogenated alkyl group (sometimes referred to as a halogenated alkyl group, hereinafter). The partially halogenated alkyl group refers to an alkyl group in which a part of the hydrogen atoms are substituted with halogen atoms, and the completely halogenated alkyl group refers to an alkyl group in which all of the hydrogen atoms are substituted with halogen atoms. Examples of the halogen atom include a fluorine atom, a chlorine atom, a bromine atom, and an iodine atom. It is particularly preferably a fluorine atom. That is, the halogenated alkyl group is preferably a fluorinated alkyl group.

The aryl group preferably has 4 to 20 carbon atoms, more preferably 4 to 10 carbon atoms, and most preferably 6 to 10 carbon atoms. The aryl group is particularly preferably a partially or completely halogenated aryl group. Further, the partially halogenated aryl group refers to an aryl group in which a part of the hydrogen atoms are substituted with halogen atoms, and the completely halogenated aryl group refers to an aryl group in which all of the hydrogen atoms are substituted with halogen atoms.

$R^{31}$ is particularly preferably an unsubstituted alkyl group having 1 to 4 carbon atoms, or a fluorinated alkyl group having 1 to 4 carbon atoms.

The organic group of $R^{32}$ is preferably a straight-chained, branched, or cyclic alkyl group, an aryl group, or a cyano group. Examples of the alkyl group and the aryl group of $R^{32}$ include those as mentioned for the alkyl group and the aryl group of $R^{31}$.

As $R^{32}$, an unsubstituted alkyl group having 1 to 8 carbon atoms, or a fluorinated alkyl group having 1 to 8 carbon atoms is particularly preferred.

More preferable examples of the oxime sulfonate-based acid generator include a compound represented by the following general formula (B-2) or (B-3).

Chemical Formula 36

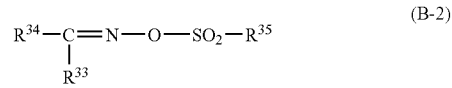

wherein $R^{33}$ is a cyano group, an unsubstituted alkyl group, or a halogenated alkyl group; $R^{34}$ is an aryl group; and $R^{35}$ is an unsubstituted alkyl group or a halogenated alkyl group.

Chemical Formula 37

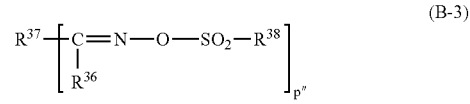

wherein $R^{36}$ is a cyano group, an unsubstituted alkyl group, or a halogenated alkyl group; $R^{37}$ is an aromatic di-valent or tri-valent hydrocarbon; $R^{38}$ is an unsubstituted alkyl group, or a halogenated alkyl group; and p" is 2 or 3.

In the general formula (B-2), the unsubstituted alkyl group or the halogenated alkyl group of $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group of $R^{33}$ is preferably one in which 50% or more of the hydrogen atoms of the alkyl group are fluorinated, more preferably one in which 70% or more of the hydrogen atoms of the alkyl group are fluorinated, and most preferably one in which 90% or more of the hydrogen atoms of the alkyl group are fluorinated.

Examples of the aryl group of $R^{34}$ include a group in which one hydrogen atom has been removed from the ring of an aromatic hydrocarbon such as a phenyl group, a biphenylyl group, a fluorenyl group, a naphthyl group, an anthracyl group, and a phenanthryl group; and a heteroaryl group in which a part of the oxygen atoms constituting those rings are substituted with heteroatoms such as an oxygen atom, a sulfur atom, and a nitrogen atom. Among these, a fluorenyl group is preferred.

The aryl group of $R^{34}$ may have a substituent such as an alkyl group having 1 to 10 carbon atoms, a halogenated alkyl group, and an alkoxy group. The alkyl group or the halogenated alkyl group as the substituent preferably has 1 to 8 carbon atoms, and more preferably 1 to 4 carbon atoms. Further, the halogenated alkyl group is preferably a fluorinated alkyl group.

The unsubstituted alkyl group or the halogenated alkyl group of $R^{35}$ preferably has 1 to 11 carbon atoms, more preferably 1 to 8 carbon atoms, and most preferably 1 to 6 carbon atoms.

$R^{35}$ is preferably a halogenated alkyl group, more preferably a fluorinated alkyl group, and most preferably a partially fluorinated alkyl group.

The fluorinated alkyl group of $R^{35}$ is preferably one in which 50% or more of the hydrogen atoms of the alkyl group are fluorinated, more preferably one in which 70% or more of the hydrogen atoms of the alkyl group are fluorinated, and most preferably one in which 90% or more of the hydrogen atoms of the alkyl group are fluorinated, thus giving higher acidity of an acid generated. Most preferably, it is one in which 100% of the hydrogen atoms of the alkyl group are completely fluorinated.

In the general formula (B-3), examples of the unsubstituted alkyl group or the halogenated alkyl group of $R^{36}$ include the same as the unsubstituted alkyl group or the halogenated alkyl group of $R^{33}$.

Examples of the aromatic di-valent or tri-valent hydrocarbon group of $R^{37}$ include a group in which one or two hydrogen atoms have been removed from the aryl group of $R^{34}$.

Examples of the unsubstituted alkyl group or the halogenated alkyl group of $R^{38}$ include the same as those described above for the unsubstituted alkyl group or the halogenated alkyl group of $R^{35}$.

p" is preferably 2.

Specific examples of the oxime sulfonate-based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl] acetonitrile, α-(tosyloxyiuino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(Propylsulfonyloxyimino)-p-methylphenylacetonitrile, and α-(methylsulfonyloxyimino)-p-bromophenylacetonitrile.

In addition, the oxime sulfonate-based acid generators as disclosed in Japanese Unexamined Patent Application, First Publication No. H09-208554 (see Paragraphs 0012 to 0014, Chemical Formulas 18 to 19), and the oxime sulfonate-based acid generators as disclosed in WO2004/074242 A2 (see pp. 65 to 85, Examples 1 to 40) can also be suitably used.

Further, examples of suitable oxime sulfonate-based acid generator include the following compounds.

Chemical Formula 38

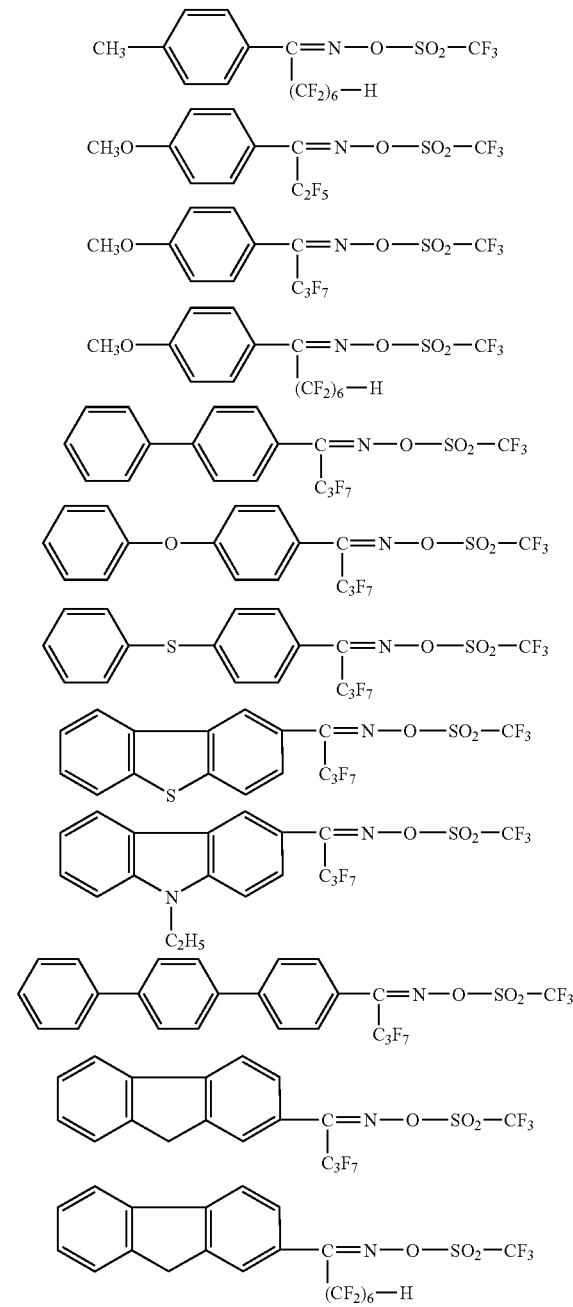

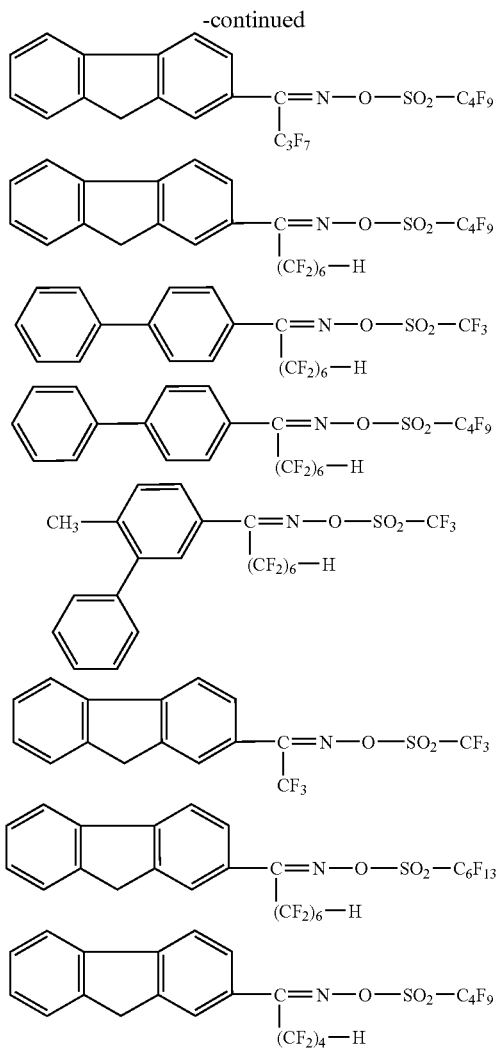

Among the above-exemplified compounds, the following four compounds are preferred.

Chemical Formula 39

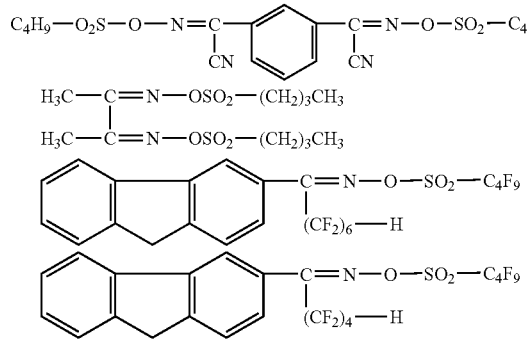

Among the diazomethane-based acid generators, specific examples of bisalkyl or bisarylsulfonyl diazomethanes include bis(isopropylsulfonyl) diazomethane, bis(p-toluenesulfonyl) diazomethane, bis(1,1-dimethylethylsulfonyl) diazomethane, bis(cyclohexylsulfonyl) diazomethane, and bis(2, 4-dimethylphenylsulfonyl) diazomethane.

Further, the diazomethane-based acid generators as disclosed in Japanese Unexamined Patent Application, First Publication Nos. H11-035551, H11-035552, and H11-035573 can also be suitably used.

In addition, examples of the poly(bisulfonyl)diazomethanes include 1,3-bis(phenylsulfonyldiazomethylsulfonyl)propane, 1,4-bis(phenylsulfonyldiazomethylsulfonyl) butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis (cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane, as disclosed in Japanese Unexamined Patent Application, First Publication No. H11-322707.

As the component (B), the acid generator may be used alone or in a combination of two or more kinds thereof.

In the present invention, as the component (B), an onium salt having a fluorinated alkylsulfonic acid ion as an anion is preferably used.

The content of the component (B) is 0.5 to 30 parts by mass, and preferably 1 to 10 parts by mass, based on 100 parts by mass of the component (A). If the amount is within the above range, the pattern formation is sufficiently performed. Further, a uniform solution can be obtained, and storage stability is better. Accordingly, the range is considered preferable.

Component (C)

Component (C) is a resin including a constituent unit (c1) represented by the following general formula (c1).

Chemical Formula 40

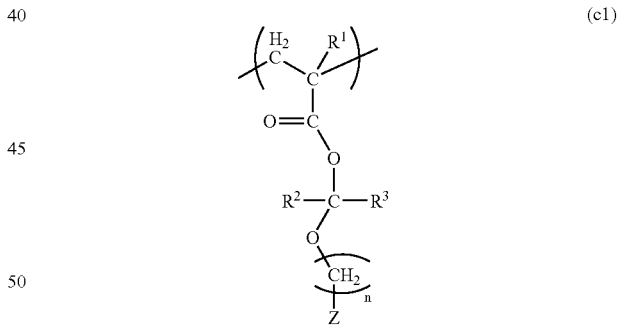

wherein $R^1$ is a hydrogen atom or a methyl group; $R^2$ and $R^3$ are each independently represents a hydrogen atom or an alkyl group having 1 to 5 carbon atoms; n is an integer of 0 to 3; and Z is an aliphatic cyclic group having 4 to 12 carbon atoms, which has a fluorine atom and/or a fluorinated alkyl group as a substituent.

In the formula (c1), $R^1$ is a hydrogen atom or a methyl group, and preferably a methyl group.

$R^2$ and $R^3$ are each independently represents a hydrogen atom or an alkyl group having 1 to 5 carbon atoms. Specific examples of the alkyl group of $R^2$ and $R^3$ include a methyl group, an ethyl group, a propyl group, an isopropyl group, an n-butyl group, an isobutyl group, a tert-butyl group, a pentyl group, an isopentyl group, and a neopentyl group. Among these, an ethyl group or an ethyl group is preferred, and a methyl group is particularly preferred.

In the present invention, it is preferable that at least one of $R^2$ and $R^3$ be a hydrogen atom; it is more preferable that one of $R^2$ and $R^3$ be a hydrogen atom, and the other be a hydrogen atom or a methyl group; and it is most preferable that both of $R^2$ and $R^3$ be hydrogen atoms.

n is an integer of 0 to 3, preferably an integer of 0 to 2, more preferably 0 or 1, and most preferable 1.

Z is an aliphatic cyclic group having 4 to 12 carbon atoms, containing a fluorine atom and/or fluorinated alkyl group as a substituent.

As used herein, the expression, the aliphatic cyclic group "has a substituent" means that a substituent is directly bonded with an atom constituting a ring of the aliphatic cyclic group.

In the present invention, the aliphatic cyclic group of Z is required to have either or both of at least a fluorine atom and a fluorinated alkyl group, and particularly preferably a fluorinated alkyl group, as a substituent.

The fluorinated alkyl group is an alkyl group in which a part or all of the hydrogen atoms have been substituted with fluorine atoms.

As the alkyl group that has not been substituted with fluorine atoms, a straight-chained or branched alkyl group is preferred, and it preferably has 1 to 5 carbon atoms, still more preferably 1 to 4 carbon atoms, and most preferably 1 to 2 carbon atoms.

Specific examples thereof include the same as the alkyl groups that are exemplified above as the lower alkyl group of $R^2$, and the lower alkyl group of $R^3$.

As the fluorinated alkyl group, a perfluoroalkyl group in which all of the hydrogen atoms of the alkyl group have been substituted with fluorine atoms is preferred, those having 1 to 5 carbon atoms are more preferred, and a trifluoromethyl group is most preferred.

In Z, the aliphatic cyclic group may have substituents, in addition to a fluorine atom and a fluorinated alkyl group. Examples of such other substituents include a lower alkyl group having 1 to 5 carbon atoms, an alkoxy group having 1 to 5 carbon atoms, and an oxygen atom (=O).

The number of the substituents in the aliphatic cyclic group of Z is preferably 1 to 3, more preferably 1 to 2, and most preferably 1.

The position at which the substituent is bonded is not particularly limited. From a viewpoint of easy synthesis, it is preferable that a fluorine atom or a fluorinated alkyl group be bonded with an atom that has been bonded with an atom adjacent to at least Z among the atoms constituting the aliphatic cyclic group (in the case of n=0, the adjacent atom is an oxygen atom, and in the case of n=1 to 3, the adjacent atom is a carbon atom).

In Z, the structure of the basic ring in which a substituent is excluded from the "aliphatic cyclic group" is not limited to a ring consisting of carbon and hydrogen (a hydrocarbon ring), but a hydrocarbon ring is preferred.

The aliphatic cyclic group may be saturated or unsaturated, but is usually preferably saturated.

The aliphatic cyclic group in Z may be a monocyclic group or a polycyclic group. From a viewpoint of etching resistance, the aliphatic cyclic group in Z is preferably a polycyclic group.

Specific examples of Z in which the aliphatic cyclic group is a monocyclic group include a group in which one hydrogen atom has been removed from a monocycloalkane containing a fluorine atom and/or a fluorinated alkyl group as a substituent. Examples of the monocycloalkane include cyclopentane and cyclohexane.

Specific examples of Z in which the aliphatic cyclic group is a polycyclic group include a group in which one hydrogen atom has been removed from a polycycloalkane (bicycloalkane, tricycloalkane, or tetracycloalkane) containing a fluorine atom and/or a fluorinated alkyl group as a substituent. Specific examples of the polycycloalkane include adamantane, norbornane, isobornane, tricyclodecane, and tetracyclododecane.

In the present invention, from a viewpoint of etching resistance, etc., Z is preferably an aliphatic polycyclic group that contains at least a fluorine atom and/or a fluorinated alkyl group as a substituent, more preferably a group in which one hydrogen atom has been removed from norbornane that contains at least a fluorine atom and/or a fluorinated alkyl group as a substituent, and particularly preferably a 2-norbornyl group in which a fluorine atom or a fluorinated alkyl group is bonded at a 2 position.

In the present invention, the constituent unit (c1) is preferably represented by the following general formula (c1-1).

Chemical Formula 41

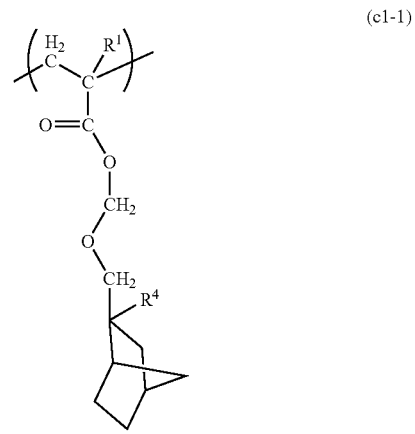

(c1-1)

wherein $R^1$ is a hydrogen atom or a methyl group; and $R^4$ is a fluorine atom or a fluorinated alkyl group.

The general formula (c1-1) corresponds to the general formula (c1), wherein $R^2$ and $R^3$ are hydrogen atoms, n is 1, and Z is a 2-norbornyl group having a fluorine atom or a fluorinated alkyl group bonded at a 2 position.

$R^1$ in the formula (c1-1) is the same as defined above.

$R^4$ is preferably a fluorinated alkyl group, and examples of the fluorinated alkyl group include the same as those mentioned for the fluorinated alkyl group that are exemplified as a substituent of Z.

The component (C) consists of the constituent units (c1) only. In the component (C), the constituent unit (c1) may be used alone, or in a combination of two or more kinds thereof.

The component (C) can be obtained by polymerization of monomers that derive constituent units (c1), using a known radical polymerization process, etc., by means of a radical polymerization initiator.

The monomer that derives the constituent unit (c1) is a compound (I) represented by the following general formula (I). By polymerization of the compound (I), the ethylenic double bond is dissociated, to form the constituent unit (c1), thereby obtaining a resin (component (C)) that includes the constituent unit (c1).

Chemical Formula 42

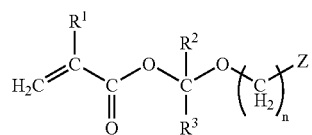
(I)

wherein $R^1$, $R^2$, $R^3$, n, and Z are each independently the same as $R^1$, $R^2$, $R^3$, n, and Z in the formula (c1).

The compound (I) can be synthesized, for example, by synthesizing a chloroalkyl ether compound represented by the formula Cl—C($R^2$)($R^3$)—O—(CH$_2$)$_n$-Z, using an alcohol compound represented by the formula HO—(CH$_2$)$_n$-Z (wherein n and Z are each independently the same as n and Z in the formula (I)) as a starting material, and then reacting the chloroalkyl ether compound with a methacrylic acid or an acrylic acid.

A method for synthesizing the chloroalkyl ether compound is not particularly limited, and any known method can be carried out. For example, a chloroalkyl ether compound in which $R^2$ and $R^3$ are both hydrogen atoms, that is, a chloromethyl ether compound represented by the formula Cl-CH$_2$—O—(CH$_2$)$_n$-Z, can be synthesized by dissolving an alcohol compound represented by the formula HO—(CH$_2$)$_n$-Z and paraformaldehyde in an organic solvent, blowing hydrogen chloride gas (HCl) into the organic solvent, and then heating it (at about 40 to 100° C.), as shown in the following reaction scheme, or by other means.

Chemical Formula 43

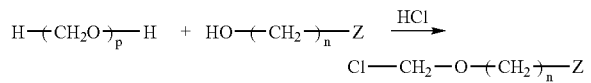

wherein p represents a polymerization degree of paraformaldehyde. n and Z are each the same as n and Z in the formula (I).

The mass average molecular mass (Mw) of the component (C) (as measured by gel permeation chromatography, in terms of polystyrene) is not particularly limited, but it is preferably 3000 to 50000, more preferably 5000 to 30000, and most preferably 5000 to 20000. If the mass average molecular mass is less than the upper limit, sufficient solubility in a resist solvent to be used as a resist is obtained. If the mass average molecular mass is more than the lower limit, the dry etching resistance or the cross-sectional shape of the resist pattern is good.

Further, the dispersibility (Mw/Mn) is preferably 1.0 to 5.0, more preferably 1.0 to 3.0, and still more preferably 1.2 to 2.5. Mn refers to a number average molecular mass.

The component (C) may be used alone, or in a combination of two or more kinds thereof.

The content of the component (C) in the positive resist composition for immersion lithography of the present invention is preferably 0.1 to 20 parts by mass, more preferably 0.5 to 20 parts by mass, still more preferably 1 to 10 parts by mass, and most preferably 1 to 5 parts by mass, based on 100 parts by mass of the component (A). If the content of the component (C) is no less than the lower limit, the effect of improving the hydrophobicity of a resist composition is enhanced. If the content of the component (C) is no more than the upper limit, the lithography characteristics are improved.

By incorporation of the component (C) in the positive resist composition for immersion lithography of the present invention, the hydrophobicity can be improved, while not interfering with the lithography characteristics. It is believed that the reason why such an effect can be obtained, is as follows. That is, when a resist film is formed using the positive resist composition of the present invention, the resulting resist film exhibits high hydrophobicity which is caused by incorporation of a fluorine atom in the component (C). Further, when an acid is generated from the component (B) by exposure, a linkage between an oxygen atom bonded with a carbonyl group in the constituent unit (c1) and a carbon atom bonded with $R^2$ and $R^3$ is dissociated through the action of the acid, and a terminal portion (—C($R^1$)($R^2$)—O—(CH$_2$)$_n$-Z), which contains Z, is also dissociated, thereby forming a carboxyl group. As a result, the hydrophobicity of an unexposed area is maintained to be high, while the hydrophilicity of an exposed area is greatly improved, which presumably contributes to improvement of lithography characteristics.

In the present invention, the terminal portion, (—C($R^2$)($R^3$)—O—(CH$_2$)$_n$-Z), of the constituent unit (c1) may be a group capable of inhibiting dissolution (a dissolution-inhibiting group), or may not be a dissolution-inhibiting group. If the terminal portion is a dissolution-inhibiting group, a resin containing the constituent units (c1) is included in the component (A) in that its alkali solubility is increased under action of an acid. However, in the present case, the resin is intended to correspond to the component (C), not the component (A).

That is, a resin containing the constituent units (c1) is not included in the component (A).

Optional Component

Preferably, the positive resist composition for immersion lithography of the present invention can further include a nitrogen-containing organic compound (D) (referred to as the component (D), hereinafter) as an optional component. By using the compound, the shape of the resist pattern, the post exposure stability of the latent image formed by the pattern-wise exposure of the resist layer, and the like are improved.

A multitude of these nitrogen-containing organic compounds have already been proposed as the component (D), and any of these known compounds can be optionally used.

Among these, an aliphatic amine is preferred, and a secondary aliphatic amine or tertiary aliphatic amine is particularly preferred. As used herein, the aliphatic amine refers to amine having at least one aliphatic group, and the aliphatic group preferably has 1 to 12 carbon atoms.

Examples of the aliphatic amine include an amine in which at least one hydrogen atom of ammonia, $NH_3$, is substituted with an alkyl group having 12 or less carbon atoms, or a hydroxyalkyl group (alkyl amine or alkyl alcohol amine), or a cyclic amine.

Examples of the alkylamine and the alkyl alcoholamine include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, tri-n-dodecylamine; and alkyl alcoholamines such as diethanolamine, triethanolamine, diisopropanolainine, triisopropanolamine, di-n-octanolamine, and tri-n-octanolamine. Among these, alkyl alcoholamine and trialkylamine are preferred, and alkyl alcoholamine is more preferred. Among the alkyl alcoholamines, an alkyl alcoholamine that contains an alkyl group having 2 to 5 carbon atoms is preferred, and triethanolamine and/or triisopropanolamine is/are most preferred.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo [2.2.2]octane.

The component (D) may be used alone, or in a combination of two or more kinds thereof.

If the component (D) is contained in the resist composition, it is used in an amount within a range from usually 0.01 to 5.0 parts by mass, based on 100 parts by mass of the component (A).

The positive resist composition of the present invention can further include at least one compound (E) selected from the group consisting of an organic carboxylic acid, and a phosphorus oxo acid and a derivative thereof (E) (referred to as the component (E), hereinafter) as another optional component, in order to prevent any deterioration in sensitivity, and to improve the resist pattern shape and the post exposure stability of the latent image formed by the pattern-wise exposure of the resist layer, etc.

Preferable examples of the organic carboxylic acid include acetic acid, malonic acid, citric acid, malic acid, succinic acid, benzoic acid, and salicylic acid.

Examples of the phosphorus oxo acid and a derivative thereof include phosphoric acid, phosphonic acid, and phosphinic acid, and among these, phosphonic acid is particularly preferred.

Examples of the derivative of the phosphorus oxo acid include an ester in which a hydrogen atom of the oxo acid has been substituted with a hydrocarbon group, and examples of the hydrocarbon group include an alkyl group having 1 to 5 carbon atoms, and an aryl group having 6 to 15 carbon atoms.

Examples of the derivative of the phosphoric acid include a phosphoric acid ester such as phosphoric acid di-n-butyl phosphate and diphenyl phosphate.

Examples of the derivative of the phosphonic acid include a phosphonic acid ester such as phosphonic acid dimethylester, phosphonic acid di-n-butylester, phenylphosphonic acid, phosphonic acid diphenylester, and phosphonic acid dibenzylester Examples of the derivative of the phosphinic acid include a phosphinic acid ester such as phenylphosphinic acid.

The component (E) may be used alone or in a combination of two or more kinds thereof.

If the component (E) is contained in the resist composition, it is typically used in an amount within a range from 0.01 to 5.0 parts by mass, based on 100 parts by mass of the component (A).

Miscible additives such as an additional resin for improving the performances of a resist film, a surfactant for improving the applicability, a dissolution inhibitor, a plasticizer, a stabilizer, a colorant, a halation prevention agent, and a dye can also be further added to the positive resist composition for immersion lithography of the present invention according to need.

The positive resist composition for immersion lithography of the present invention can be produced by dissolving the above-described materials in an organic solvent (referred to as the component (S), hereinafter).

The component (S) may be any solvent capable of dissolving various components to generate a uniform solution, and one, or two or more solvents selected from known materials that are used as the solvents for conventional chemically amplified resists can be suitably selected and used.

Examples of the component (S) include lactones such as γ-butyrolactone; ketones such as acetone, methyl ethyl ketone, cyclohexanone, methyl-n-amylketone, methyl isoamyl ketone and 2-heptanone; polyhydric alcohols and derivatives thereof such as ethylene glycol, ethylene glycol monoacetate, diethylene glycol monoacetate, propylene glycol monoacetate, and dipropylene glycol monoacetate; the derivatives of polyhydric alcohols, including ether bond-containing compounds such as ether bonds, e.g., monoalkyl ethers or monophenyl ethers such as monomethyl ether, monoethyl ether, monopropyl ether, and monobutyl ether of the above-described polyhydric alcohols or ester bond-containing compounds; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzyl ether, cresylmethyl ether, diphenyl ether, dibenzyl ether, phenetole, butylphenyl ether, ethylbenzene, diethylbenzene, amylbenzene, isopropylbenzene, toluene, xylene, cimene, and mesitylene.

These organic solvents can be used alone, or as a mixed solvent of two or more kinds thereof.

Among these, propylene glycol monomethyl ether acetate (PGMEA), propylene glycol monomethyl ether (PGME), and EL are preferred.

Further, a mixed solvent of propylene glycol monomethyl ether acetate, PGMEA, and a polar solvent is preferred. In this case, the blending ratio (mass ratio) of PGMEA to the polar solvent is suitably determined based on the compatibility between PGMEA and the polar solvent, but it is preferably within a range from 1:9 to 9:1, and more preferably from 2:8 to 8:2.

Specifically, in the case where EL is added as the polar solvent, the mass ratio of PGMEA:EL is preferably within a range from 1:9 to 9:1, and more preferably from 2:8 to 8:2. Further, in the case where PGME is added as the polar solvent, the blending ratio (mass ratio) of PGMEA:PGME is preferably within a range from 1:9 to 9.1, and more preferably from 2.8 to 8:2.

Furthermore, as the component (S), a mixed solvent of at least one selected from PGMEA and EL, and γ-butyrolactone, is also preferred. In such cases, the mass ratio of the former and latter components in the mixed solvent is preferably within a range from 70:30 to 95:5.

The amount of the component (S) used is not particularly limited, but it is suitably selected according to the applied film thickness at a concentration which allows application to a substrate. Generally, the amount of the organic solvent is used in an amount such that the solid concentration of the resist composition is in the range of from 2 to 20% by mass, and preferably from 5 to 15% by mass.

Dissolution of materials in the component (S) can be carried out simply by mixing and stirring each of the above-described components by a conventional method. Further, if necessary, the components may be dispersed and mixed by means of a dispersion machine such as a dissolver, a homogenizer, and a three-roll mill, further optionally followed by filtration using a mesh filter, a membrane filter, or the like.

The positive resist composition for immersion lithography of the present invention has good lithography characteristics, and suitable hydrophobicity for immersion lithography that are required for a resist composition used in immersion lithography. Accordingly, it is suitably used for immersion lithography.

The immersion lithography is a process including a step of during exposure, subjecting a portion between a lens that is conventionally filled with air or inert gas such as nitrogen, and a resist film on a wafer to exposure (immersion exposure), in the state where it is immersed in a solvent (a immersion medium) having a higher refractive index than that of air, as described above. In the immersion lithography, by the contact between the resist film and the liquid immersion solvent, the materials in the resist film (the component (B), the component (D), etc.) are eluted in a liquid immersion solvent (material elution). The material elution causes phenomena such as denaturation of a resist layer, and change in the refractive index of a liquid immersion solvent, thereby deteriorating the lithography characteristics.

The amount of eluted materials is affected by the characteristics (for example, hydrophilicity and hydrophobicity) of the surface of the resist film. Thus, for example, if the hydrophobicity of the surface of the resist film is increased, the material elution is reduced.

The positive resist composition for immersion lithography of the present invention that contains the component (C) has higher hydrophobicity of the surface of the resist film formed by using the positive resist composition, as compared with those that do not contain the component (C). Accordingly, by using the positive resist composition for immersion lithography of the present invention, the material elution during immersion exposure can be inhibited.

Further, the positive resist composition for immersion lithography of the present invention has good lithography characteristics such as sensitivity, resolution, and etching resistance. For example, the positive resist composition for immersion lithography of the present invention can be used to form a fine resist pattern having a dimension of 120 nm or less. Further, the positive resist composition for immersion lithography of the present invention can be added with the component (C) containing an aliphatic cyclic group, thereby exhibiting excellent etching resistance. Such etching resistance is particularly good, if the aliphatic cyclic group as Z in the formula (c1-1) is a polycyclic group.

As such, the positive resist composition for immersion lithography of the present invention is suitable for immersion lithography due to its high hydrophobicity and good lithography characteristics.

The resist film formed by using the positive resist composition for immersion lithography of the present invention that includes the component (C), has higher hydrophobicity of a resist film, as compared with those that do not include the component (C), and has changes in a contact angle to water, for example, a static contact angle (an angle between the surface of a water droplet on a resist film in the horizontal state and the surface of the resist film), a dynamic contact angle (when the resist film is inclined, the contact angle at which a water droplet starts to be rolled down, including a contact angle (sweepforward angle) at a forward endpoint in the sliding direction of the water droplet), and a contact angle (sweepback angle) at a backward endpoint in the sliding direction of the water droplet), and a sliding angle (when the resist film is inclined, an inclination angle of the resist film at which a water droplet starts to be rolled down). For example, as the hydrophobicity of the resist film becomes higher, the static contact angle and the dynamic contact angle become larger, and the sliding angle becomes smaller.

As used herein, the sweepforward angle refers to an angle $?_1$ between the surface of a liquid drop at a lower part $1a$ of a liquid drop 1 and the surface 2 on which the liquid drop 1 has been placed, when the liquid drop 1 starts to move (drop) on the surface 2 by gradually inclining the surface 2 as shown in FIG. 1. Further, at this time (when the liquid drop 1 starts to move (drop) on the surface 2), an angle $?_2$ between the surface of a liquid drop at an upper part $1b$ of the liquid drop 1 and the surface 2 corresponds to a sweepback angle, and the inclination degree $?_3$ of the surface 2 corresponds to a sliding angle.

As used in the present specification, the static contact angle, the dynamic contact angle, and the sliding angle are measured in the following manner.

First, a resist composition solution is spin-coated on a silicone substrate, and then heated at a temperature of 90° C.

for 90 seconds to form a resist film. Thereafter, measurements for the resulting resist film can be conducted by means of a commercially available measurement apparatus such as DROP MASTER-700 (manufactured by Kyowa Interface Science Co. Ltd.), AUTO SLIDING ANGLE: SA-30 DM (manufactured by Kyowa Interface Science Co. Ltd.), and AUTO DISPENSER: AD-31 (manufactured by Kyowa Interface Science Co. Ltd.).

The positive resist composition for immersion lithography of the present invention preferably has a sweepback angle of 50 degrees or more, more preferably 55 to 150 degrees, particularly preferably 55 to 130 degrees, and most preferably 60 to 100 degrees, as measured for the resist film obtained by using the resist composition. If the sweepback angle is 55 degrees or more, the effect of inhibiting the material elution during immersion exposure is enhanced. Although the reason is not clear, one of the main reasons for this is believed to be related with the hydrophobicity of the resist film. That is, it is thought that since an aqueous substance such as water is used as the immersion medium, higher hydrophobicity has an influence on the rapid removal of the immersion medium from the surface of the resist film after the immersion exposure. Further, if the sweepback angle is 150 degrees or less, lithography characteristics, etc. are good.

The levels of the above-mentioned various angles (e.g., a static contact angle, a dynamic contact angle (a sweepforward angle and a sweepback angle), a sliding angle, etc.) can be adjusted by changing the composition of the positive resist composition for immersion lithography, for example, the amount of the component (C) added, and the kind of the component (A). For example, as the content of the component (C) becomes higher, the hydrophobicity of the resulting resist film becomes higher, the static contact angle or the dynamic contact angle becomes larger, and the sliding angle becomes smaller.

Furthermore, in the present invention, elution of the materials from the resist film into the liquid immersion solvent during immersion exposure is inhibited, as described above. Thus, by using the positive resist composition for immersion lithography of the present invention in the immersion lithography, denaturation of the resist film or change in the refractive index of the liquid immersion solvent can be inhibited. Accordingly, by inhibiting the change in the refractive index of the liquid immersion solvent, the shape of the formed resist pattern, or the like is good.

In addition, contamination of the lens of the exposure apparatus can be reduced, which in turn eliminates the need for a means for protecting them from deterioration, and contributes to simplification of the process or the exposure apparatus.

Further, as described above, if immersion exposure is carried out by using a scanning type immersion lithography apparatus as described in Proceedings of SPIE, Vol. 5754, pp. 119-128 (2005) (Non-Patent Document 1), the tracing property of water, characterized in that a immersion medium traces, following the shift of the lens is required. However, in the present invention, the hydrophobicity of the resist film is higher, and thus the tracing property of water is higher. Moreover, the positive resist composition for immersion lithography of the present invention has good lithography characteristics, and can be used as a resist for immersion lithography to form a resist pattern without causing any problem in practical use.

As such, the positive resist composition for immersion lithography of the present invention has good lithography characteristics (e.g., sensitivity, resolution, and etching resistance), as well as excellent hydrophobicity, inhibition of material elution, the tracing property of water, and the like. Accordingly, it has well-established characteristics that are required as a resist material for immersion lithography.

Method for Forming Resist Pattern

Hereinbelow, the method for forming a resist pattern according to the present invention is described.

The method of forming the resist pattern of the present invention includes the steps of applying the positive resist composition for immersion lithography of the present invention to form a resist film on a substrate; subjecting the resist film to immersion exposure; and developing the resist film to form a resist pattern.

One preferable embodiment of the method for forming a resist pattern according to the present invention is described below.

First, the positive resist composition for immersion lithography of the present invention is applied onto the surface of a substrate such as a silicon wafer by using a spinner or the like, and optionally subjected to pre-baking (post applied bake (PAB) treatment) to form a resist film.

The support is not particularly limited, and a conventionally known one can be used as the support, including a substrate for an electronic part, which may have a predetermined wiring pattern formed thereon. Specifically, examples of the support include a silicon wafer, a substrate made of metal such as copper, chromium, iron, and aluminum, and a glass substrate. As a material for a wiring pattern, for example, copper, aluminum, nickel, gold, or the like can be used.

Further, as the support, those having an inorganic and/or organic film provided on the above-described substrate can be used. Examples of the inorganic film include an inorganic anti-reflective film (inorganic BARC). Examples of the organic film include an organic anti-reflective film (organic BARC) and an organic film such as a lower organic film in a multilayer resist method.

As used herein, the multilayer resist method refers to a method including the steps of providing at least one layer of an organic film (lower organic film) and at least one layer of a resist film (upper resist film) on a substrate, and patterning the lower organic film through a resist pattern formed on the upper resist film as a mask. By this method, a pattern having a high aspect ratio can be formed. That is, according to a multilayer resist, a required thickness can be attained by the use of the lower organic film. As a result, a thinner resist film is can be obtained and a fine pattern with a high aspect ratio can be formed.

The multilayer resist methods can be basically classified into two types, that is, a method in which a two-layer structure composed of an upper resist film and a lower organic film is used (a two-layer resist method), and a method in which a multi-layer structure, having three or more layers, composed of an upper resist film, a lower organic film, and at least one intermediate layer (a metal thin film, etc.) interposed therebetween is used (a three-layer resist method).

After forming the resist film, an organic anti-reflective film is further provided on the resist film, thereby obtaining a three-layer laminate composed of the support, the resist film, and the anti-reflective film. The anti-reflective film provided on the resist film is preferably soluble in an alkali developer.

The above-described processes can be carried out by using a well-known method. Preferably, the operating condition, etc. is suitably adjusted according to the composition and the characteristics of the used positive resist composition for immersion lithography.

Next, the obtained resist film is subjected to selective immersion lithography (Liquid Immersion Lithography) through a desired mask pattern. At this time, a solvent (immersion medium) having a higher refractive index than that of air is preliminarily filled between the resist film and a bottom lens of an exposure apparatus, and then exposure (immersion exposure) is carried out in such a state.

The wavelength used for exposure is not particularly limited, and exposure can be cared out using radiation such as an ArF excimer laser, a KrF excimer laser, and an $F_2$ laser. The resist composition according to the present invention is effective for a KrF or an ArF excimer laser, and particularly an ArF excimer laser.

As the immersion medium, a solvent which has a higher refractive index than that of air, and a lower refractive index than that of a resist film formed by using the positive resist composition for immersion lithography is preferred. The refractive index of the solvent is not particularly limited, as long as it is within the above-described range.

Examples of the solvent which has a higher refractive index than that of air, and a lower refractive index than that of a resist film include water, a fluorine-based inactive liquid, a silicone-based solvent, and a hydrocarbon-based solvent.

Specific examples of the fluorine-based inactive liquid include a liquid having a fluorine-based compound such as $C_3HCl_2F_5$, $C_4F_9OCH_3$, $C_4F_9OC_2H_5$, and $C_5H_3F_7$ as a main component. Among these, those having a boiling point of 70 to 180° C. are preferred, and those having a boiling point of 80 to 160° C. are more preferred. If the fluorine-based inactive liquid has a boiling point in the above-described range, the removal of the medium used for liquid immersion after completion of exposure can be carried out by a simple method, thereby it being preferable.

As the fluorine-based inactive liquid, a perfluoroalkyl compound in which all of the hydrogen atoms of an alkyl group have been substituted with fluorine atoms is particularly preferred. Specific examples of the perfluoroalkyl compound include a perfluoroalkyl ether compound and a perfluoroalkylamine compound.

Further, specific examples of the perfluoroalkyl ether compound include perfluoro(2-butyl-tetrahydrofuran) (boiling point: 102° C.), and examples of the perfluoroalkylamine compound include perfluorotributylamine (boiling point: 174° C.).

In particular, the positive resist composition for immersion lithography of the present invention is substantially not interfered with by water, and has excellent sensitivity, and shape of a resist pattern profile. As a result, water is preferably used as a immersion medium in the present invention. In addition, water is preferred from viewpoints of cost, safety, environmental concern, and a diversity of uses.

Then, after completion of the immersion exposure step, post exposure baking (PEB) is conducted, and then development using an alkali developer including an aqueous alkaline solution is conducted. Further, water rinsing is conducted preferably with pure water. Water rinsing can be carried out, for example, by dropping or spraying water onto the surface of the substrate while rotating the substrate, and washing out the developer on the substrate and the positive resist composition for immersion lithography dissolved by the developer. Further, by drying the resultant, a resist pattern, in which the resist film (the coated film with the positive resist composition for immersion lithography) has been patterned in the shape according to a mask pattern can be obtained.

While the present invention has been described with reference to certain preferred embodiments, it will be understood that still further structural variations such as addition, deletion, substitution, and other modifications can be made to the present invention, without departing from the spirit of the present invention. The present invention is not limited by the foregoing description, but only by the appended claims.

EXAMPLES

Hereinbelow, the present invention will be illustrated in detail with reference to the following Examples, but these examples should not be construed as limiting the scope of the invention in any way.

Synthesis Example 1

1-1: Synthesis of Compound 1

2-trifluoromethyl-2-hydroxymethylnorbornane was added to paraformaldehyde, and 2.5 equivalents of hydrogen chloride gas was blown into the 2-trifluoromethyl-2-hydroxymethylnorbornane to perform a reaction at 50° C. After completion of the reaction, a product was distilled under reduced pressure to obtain a compound 1, [2-(chloromethoxymethyl)-2-trifluoromethylnorbornane], having a structure as shown below.

Chemical Formula 44

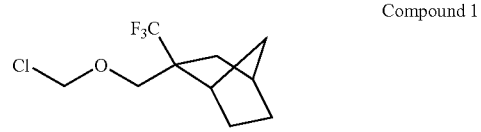

Compound 1

1-2: Synthesis of Compound 2

3.9 g of methacrylic acid was dissolved in 50 mL of tetrahydrofuran, and 5.0 g of triethylamine was added thereto. This solution was stirred at room temperature, and then 50 mL of tetrahydrofuran in which 10.0 g of the compound 1 had been dissolved was added dropwise to the solution. The resulting solution was stirred at room temperature for 12 hours and a precipitated salt was separated out by filtration.

The solvent was distilled off from the obtained filtrate and the residue was dissolved in 100 mL of ethyl acetate and washed with pure water (50 mL×3). Then, the solvent was distilled off to obtain a compound 2, [2-methyl(2-trifluoromethylnorbornyl)oxymethylmethacrylate].

For the compound 2, Infrared spectroscopy (IR) and Proton Nuclear Magnetic Resonance ($^1$H-NMR) measurement and elemental analysis was carried out. The results are shown as follows.

In the following results of $^1$H-NMR and $^{13}$C-NMR, hydrogen atoms (H) or carbon atoms (C), indicated by the above-described numeral values, are underlined.

IR (cm$^{-1}$): 2991, 2911, 2854 (?C—H), 1712 (?C═O, ester), 1638 (?C═C, vinyl), 1172, 1098 (?C—O, ester), 931 (?O—C—O, ether).

$^1$H-NMR (400 MHz, CDCl$_3$, TMS): δ 0.80-1.75 (8 H, m, 3-H$_2$, 5-H$_2$, 6-H$_2$, 7-H$_2$ norbornyl), 1.55 (3 H, s, CH$_2$═C(CH$_3$)—), 2.20 (1 H, m, 1-H norbornyl), 2.45 (1 H, m, 4-H norbornyl), 3.49-3.80 (2 H, m, —O—CH$_2$-norbornyl), 5.28-5.30 (2 H, m, —COOCH$_2$—O—), 5.50 (1 H, s, CH$_2$═C(CH$_3$)—), 6.05 (1 H, s, CH$_2$═C(CH$_3$)—).

$^{13}$C-NMR (400 MHz, CDCl$_3$, TMS): δ 18.7 (CH$_3$), 51.3 (quaternary, 2-C norbornyl), 72.3 (—O—CH$_2$-norbornyl), 90.2 (COOCH$_2$O), 126.8 (CH$_2$═), 126.9, 127.8, 128.9, 130.8 (CF$_3$), 137.0 (═C(CH$_3$)—), 167.3 (carbonyl).

Elemental Analysis: Calculated Value C$_{14}$H$_{19}$F$_3$O$_3$ (292.13): C, 57.53%; H, 6.55%; F, 19.50%; O, 16.42%.

Found Value: C, 57.28%; H, 6.52%; F, 18.64%.

The results confirm that the compound 2 has the structure as shown below.

Chemical Formula 45

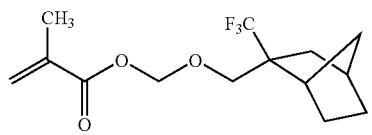

Compound 2

Synthesis of Resin (C)-1

2.3 g of the compound 2 and 0.092 g of dimethyl-2,2-azobis(isobutylate) were dissolved in 23 mL of tetrahydrofuran to perform a reaction at 80° C. for 6 hours. After completion of the reaction, hexane was added as a poor solvent thereto to obtain a powdered product. This powdered product was dried under reduced pressure to obtain 1.34 g of a target compound (resin (C)-1).

The structure of the resin (C)-1 is shown below. Here, the numeral value at the lower right corner of ( ) represents a ratio of the constituent units (% by mole). The resin (C)-1 has a molecular mass (Mw) of 16000, and a dispersibility (Mw/Mn) of 1.79.

Chemical Formula 46

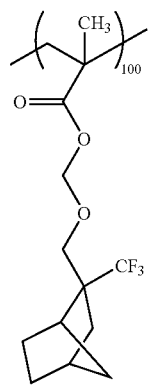

Examples 1 to 6, and Comparative Example 1

All of the components as shown in Table 1 were mixed and dissolved to prepare a positive resist composition.

TABLE 1

| | Component (A) | Component (B) | Component (C) | Component (D) | Component (S) |
|---|---|---|---|---|---|
| Example 1 | (A)-1 | (B)-1 | (C)-1 | (D)-1 | (S)-1 |
| | [100] | [5] | [0.5] | [0.25] | [1900] |
| Example 2 | (A)-1 | (B)-1 | (C)-1 | (D)-1 | (S)-1 |
| | [100] | [5] | [1] | [0.25] | [1900] |
| Example 3 | (A)-1 | (B)-1 | (C)-1 | (D)-1 | (S)-1 |
| | [100] | [5] | [2] | [0.25] | [1900] |
| Example 4 | (A)-1 | (B)-1 | (C)-1 | (D)-1 | (S)-1 |
| | [100] | [5] | [5] | [0.25] | [1900] |
| Example 5 | (A)-1 | (B)-1 | (C)-1 | (D)-1 | (S)-1 |
| | [100] | [5] | [10] | [0.25] | [1900] |
| Example 6 | (A)-1 | (B)-1 | (C)-1 | (D)-1 | (S)-1 |
| | [100] | [5] | [20] | [0.25] | [1900] |
| Comparative Example 1 | (A)-1 | (B)-1 | — | (D)-1 | (S)-1 |
| | [100] | [5] | | [0.25] | [1900] |

Each of the symbols in Table 1 has the meaning as follows, and the values in [ ] represent blending amounts (parts by mass).

(A)-1: Copolymer represented by the following formula (A)-1, having Mw=10000 and Mw/Mn=1.8. Here, the values at the lower right corner of ( ) each represent a ratio of the constituent units (% by mole) based on the total amount of all the constituent units that constitute the resin.

(B)-1: (4-Methylphenyl)diphenylsulfonium trifluoromethanesulfonate.
(C)-1: Resin (C)-1 obtained in Synthesis Example 1.
(D)-1: Triethanolamine.
(S)-1: Mixed solvent of PGMEA/PGME=6/4 (mass ratio)

Chemical Formula 47

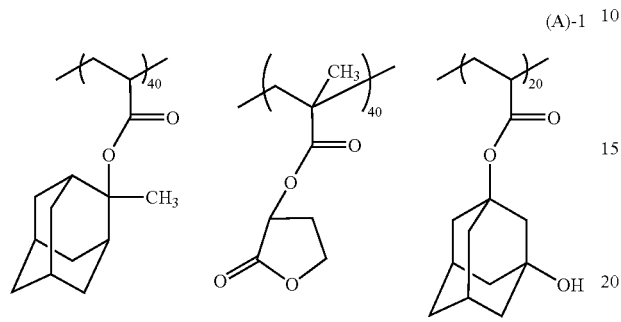

The resulting positive resist composition was evaluated as follows.

Evaluation of Hydrophobicity

In the following order, the hydrophobicity of the resist film was evaluated by measuring the sweepback angle and the sliding angle of the surface of the resist film before and after exposure.

An organic anti-reflective film composition "ARC-29" (trademark, manufactured by Brewer Science, Inc.) was applied onto an 8-inch silicon wafer by using a spinner and sintered at 205° C. for 60 sec on a hot plate to form an organic anti-reflective film having a film thickness of 77 nm. Each of the positive resist compositions of Examples 1 to 6 and Comparative Example 1 was applied onto the anti-reflective film by using a spinner and dried by prebaking it on a hot plate at 100° C. for 60 sec to form a resist film having a film thickness of 150 nm.

50 μL of water was dropped onto the surface of the resist film (the resist film before exposure) and then a sweepback angle and a sliding angle were measured by using "DROP MASTER-700" (manufactured by Kyowa Interface Science Co., Ltd.)

Further, a resist film was formed in the same manner as described, and this film was irradiated with an ArF excimer laser (193 nm) through open-frame exposure (exposure conducted without a mask) by using an ArF exposure apparatus NSR-S302A (manufactured by Nikon Corporation, NA (numerical aperture)-0.60, s=0.75), and further subjected to PEB treatment at 110° C. for 60 sec. After PEB treatment, the sweepback angle and the sliding angle of the surface of the resist film (the resist film after exposure) were measured in the same manner as described above.

The measurement results of the sweepback angles and the sliding angles of the resist film before and after exposure are shown in Table 2. Further, in Table 2, the ratio of the blending amount of the component (C) to the blending ratio of the component (A) in the resist composition (hereinafter, simply referred to as the "component (C) ratio") (unit: % by mass) is also shown.

Figure 2:
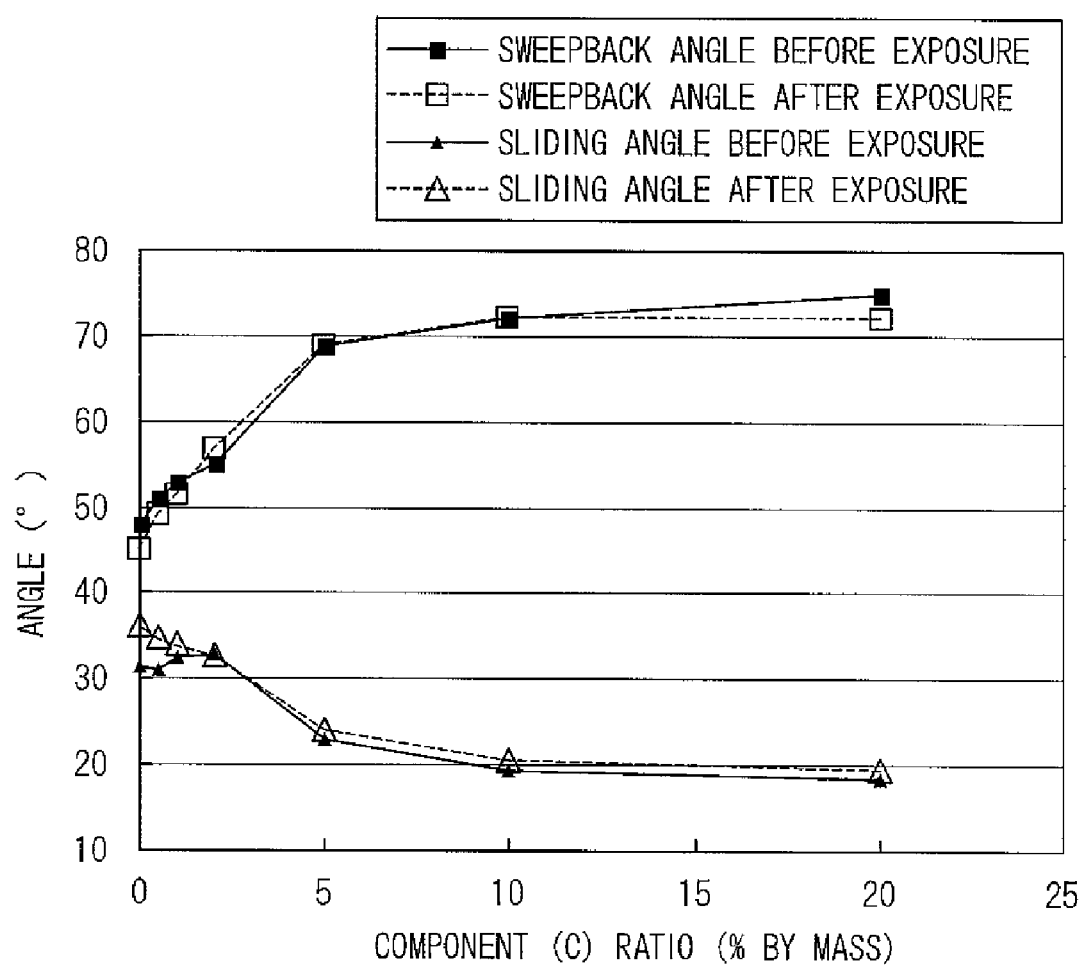
FIG. 2 is a graph illustrating the relationship between the component (C) ratio (% by mass), and the sweepback angle and sliding angle of the resist film before and after exposure in Examples.

From the results, a graph that has a horizontal axis representing the component (C) ratios (% by mass) and a vertical axis representing the sweepback angle and the sliding angles (°), before and after exposure, was plotted. This graph is shown in FIG. 2.

As shown in these results, in Examples 1 to 6 in which both of (A)-1 and (C)-1 were used, the sweepback angle is larger and the sliding angle is smaller, before and after exposure, as compared with Comparative Example 1 in which (C)-1 was not added. These results confirm that the resist films obtained by using the positive resist compositions of Examples 1 to 6 have higher hydrophobicity than that of the resist film obtained by using resist composition of Comparative Example 1.

TABLE 2

| Component | (C) ratio (% by mass) | Sweepback angle Before exposure | Sweepback angle After exposure | Sliding angle Before exposure | Sliding angle After exposure |
|---|---|---|---|---|---|
| Comparative Example 1 | 0 | 47.3 | 44.8 | 31.5 | 36.0 |
| Example 1 | 0.5 | 51.1 | 49.4 | 31.0 | 34.5 |
| Example 2 | 1 | 52.9 | 51.3 | 32.5 | 34.0 |
| Example 3 | 2 | 55.0 | 56.7 | 33.0 | 32.5 |
| Example 4 | 5 | 68.8 | 68.5 | 23.0 | 24.0 |
| Example 5 | 10 | 72.5 | 72.6 | 19.5 | 20.5 |
| Example 6 | 20 | 74.9 | 72.1 | 18.5 | 19.5 |

Evaluation of Lithography Characteristics

Each of the positive resist compositions of Examples 1 to 6 and Comparative Example 1 was used to form a resist film in the same order as for the evaluation of hydrophobicity as described above. This resist film was selectively irradiated with an ArF excimer laser (193 nm) via a mask pattern by using an ArF exposure apparatus NSR-S-302A (manufactured by Nikon Corporation, NA (numerical aperture)=0.60, s=0.75). Then, it was subject to PEB treatment at 100° C. for 60 sec and subsequently developing was conducted for 30 seconds in an aqueous solution of tetramethylammonium hydroxide (TMAH) with a concentration of 2.38% by mass at 23° C.

As a result, in any case where the positive resist composition was used a resist pattern having an inner diameter of 140 nm and a pitch of 280 nm was formed.

As shown in the results, the positive resist compositions of Examples 1 to 6 also have good performances for lithography characteristics.

Theses results confirm that by using each of the resist compositions of Examples 1 to 6 including the component (A), the component (B) and the component (C), a resist film with high hydrophobicity can be formed and good lithography characteristics are also achieved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition for immersion lithography, comprising a resin component (A) that increases its alkali solubility under action of an acid, an acid generator component (B) that generates an acid upon exposure, and a resin component (C) containing a constituent unit (c1) represented by the following general formula (c1):

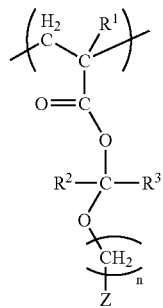

(c1)

wherein $R^1$ is a hydrogen atom or a methyl group; $R^2$ and $R^3$ are each independently represents a hydrogen atom or an alkyl group having 1 to 5 carbon atoms; n is an integer of 0 to 3; and Z is an aliphatic cyclic group having 4 to 12 carbon atoms, having a fluorine atom and/or a fluorinated alkyl group as a substituent.

2. The positive resist composition for immersion lithography according to claim 1, wherein the constituent unit (c1) is represented by the following general formula (c1-1):

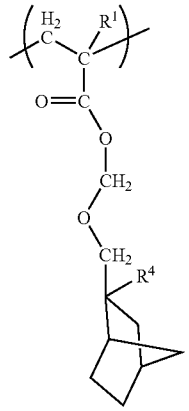

(c1-1)

wherein $R^1$ is a hydrogen atom or a methyl group; and $R^4$ is a fluorine atom or a fluorinated alkyl group.

3. The positive resist composition for immersion lithography according to claim 1, wherein the content of the resin component (C) is 0.1 to 20% by mass, based on the content of the resin component (A).

4. The positive resist composition for immersion lithography according to claim 1, wherein the resin component (A) comprises a constituent unit derived from an acrylic acid ester (a1) containing an acid dissociable, dissolution inhibiting group.

5. The positive resist composition for immersion lithography according to claim 4 wherein the resin component (A) further comprises a constituent unit derived from an acrylic acid ester (a2) containing a lactone-containing cyclic group.

6. The positive resist composition for immersion lithography according to claim 4 or 5, wherein the resin component (A) further comprises a constituent unit (a3) derived from an acrylic acid ester containing a polar group-containing aliphatic hydrocarbon group.

7. The positive resist composition for immersion lithography according to claim 1, further comprising a nitrogen-containing organic compound (D).

8. A method for forming a resist pattern, comprising:
forming a resist film on a support by using the positive resist composition for immersion lithography according to claim 1,
subjecting the resist film to immersion exposure, and
developing the resist film to form a resist pattern.

* * * * *

UNITED STATES PATENT AND TRADEMARK OFFICE
CERTIFICATE OF CORRECTION

PATENT NO.          : 7,494,762 B2
APPLICATION NO.  : 11/871399
DATED                    : February 24, 2009
INVENTOR(S)          : Irie et al.

It is certified that error appears in the above-identified patent and that said Letters Patent is hereby corrected as shown below:

On the Title Pg (Item 75) Inventors, Line 1, change "Kanagawa-ken" for Makiko Irie to --Kawasaki--.

On the Title Pg (Item 56), Line 5, under Other Publications, change "Synethsis" to --Synthesis--.

In Column 4, Line 25, change "(?1)," to --(θ1),--.

In Column 4, Line 26, change "(?2)," to --(θ2),--.

In Column 4, Line 26, change "(?3)." to --(θ3).--.

In Column 4, Line 56, change "development" to --development,--.

In Column 7, Lines 25-40 (Structure), change " 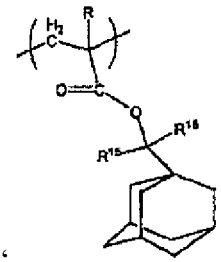 " to 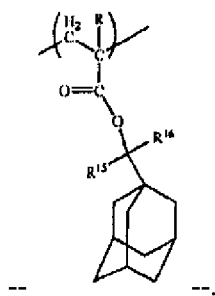 --.

In Column 9, Line 2, change "group," to --group.--.

In Column 11, Line 63, change "or" to --to--.

UNITED STATES PATENT AND TRADEMARK OFFICE
CERTIFICATE OF CORRECTION

PATENT NO.       : 7,494,762 B2
APPLICATION NO.  : 11/871399
DATED            : February 24, 2009
INVENTOR(S)      : Irie et al.

It is certified that error appears in the above-identified patent and that said Letters Patent is hereby corrected as shown below:

In Column 39, Lines 5-40 (Structures), change " 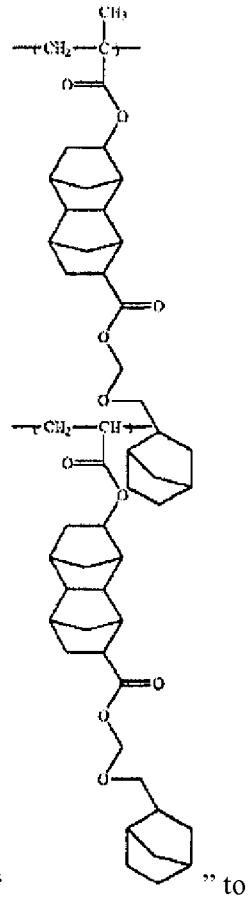 " to

UNITED STATES PATENT AND TRADEMARK OFFICE
CERTIFICATE OF CORRECTION

PATENT NO. : 7,494,762 B2
APPLICATION NO. : 11/871399
DATED : February 24, 2009
INVENTOR(S) : Irie et al.

It is certified that error appears in the above-identified patent and that said Letters Patent is hereby corrected as shown below:

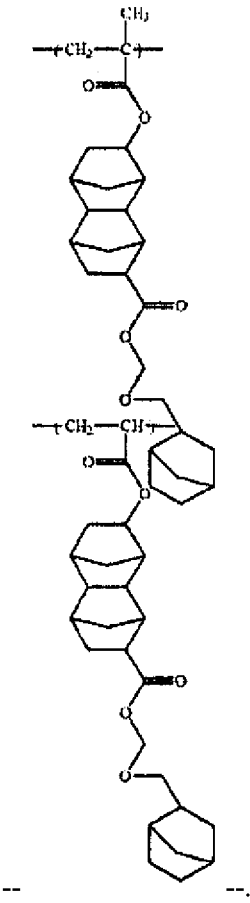

In Column 44, Line 16, change "?-butyrolactone." to --γ-butyrolactone.--.

In Column 53, Line 61, change "croup" to --group--.

In Column 60, Line 59, change "of R3′′′" to --of R1″--.

In Column 60-61, Lines 63-67 (Col. 60) 1-3 (Col. 61), Below "atoms." delete "It is preferable........synthesis." and insert the same on Col. 60, Line 61 after "atoms." as the continuation of the paragraph.

UNITED STATES PATENT AND TRADEMARK OFFICE
CERTIFICATE OF CORRECTION

PATENT NO.         : 7,494,762 B2
APPLICATION NO. : 11/871399
DATED                 : February 24, 2009
INVENTOR(S)       : Irie et al.

It is certified that error appears in the above-identified patent and that said Letters Patent is hereby corrected as shown below:

In Column 62, Line 54, after "nm" delete "n".

In Column 64, Line 61, change "11" to --10--.

In Column 65, Line 43, change "(tosyloxyiuino)" to --(tosyloxyimino)--.

In Column 69, Lines 34-36, Below "atoms." delete "Specific examples........R3." and insert the same in line 33 after "atoms." as the continuation of the paragraph.

In Column 71, Line 31, change "Cl—C(R2)(R3)—O—(CH2)¬n-Z," to --Cl—C(R2)(R3)—O—(CH2)¬n—Z,--.

In Column 71, Line 32, change "HO—(CH2)n-Z" to --HO—(CH2)n—Z--.

In Column 71, Lines 42-43 (Approx.), change "Cl-CH2—O—(CH2)n-Z," to --Cl—CH2—O—(CH2)n—Z,--.

In Column 71, Line 44 (Approx.), change "HO—(CH2)n-Z" to --HO—(CH2)n—Z--.

In Column 72, Line 36, change "—C(R1)(R2)—O—(CH2)¬n-Z," to -- —C(R1)(R2)—O—(CH2)¬n—Z,--.

In Column 72, Lines 44-45 (Approx.), change "—C(R2)(R3)—O—(CH2)¬n-Z," to -- —C(R2)(R3)—O—(CH2)¬n—Z,--.

In Column 73, Line 23, change "diisopropanolainine," to --diisopropanolamine,--.

In Column 74, Line 15, after "dibenzylester" insert --.--.

In Column 75, Line 20, change "1:9 to 9.1," to --1:9 to 9:1,--.

In Column 75, Line 21, change "2.8 to 8:2." to --2:8 to 8:2.--.

In Column 75, Line 50, change "of" to --of,--.

In Column 76, Line 53, change "?1" to --θ1--.

UNITED STATES PATENT AND TRADEMARK OFFICE
CERTIFICATE OF CORRECTION

PATENT NO. : 7,494,762 B2
APPLICATION NO. : 11/871399
DATED : February 24, 2009
INVENTOR(S) : Irie et al.

It is certified that error appears in the above-identified patent and that said Letters Patent is hereby corrected as shown below:

In Column 76, Line 58, change "?2" to --θ2--.

In Column 76, Line 61, change "?3" to --θ3--.

In Column 77, Lines 1-8, after "film." delete "Thereafter, measurements ........Ltd.)." and insert the same below "film." as a new paragraph.

In Column 79, Line 23, change "cared" to --carried--.

In Column 81, Line 15 (Approx.), change "(?C—H)," to --(vC—H),--.

In Column 81, Line 15 (Approx.), change "(?C=O)," to --(vC=O,--.

In Column 81, Line 16, change "(?C=C)," to --(vC=C,--.

In Column 81, Line 16, change "(?C—O)," to --(vC—O,--.

In Column 81, Line 17, change "(?O—C—O)," to --(vO—C—O,--.

In Column 83, Line 55 (Approx.), change "110°" to --100°--.

In Column 86, Line 33 (Approx.), in Claim 5, change "4" to --4,--.

Signed and Sealed this

Thirteenth Day of October, 2009

David J. Kappos
*Director of the United States Patent and Trademark Office*